United States Patent [19]
Kawasaki et al.

[11] Patent Number: 5,502,419
[45] Date of Patent: Mar. 26, 1996

[54] PULSE WIDTH MODULATION SIGNAL GENERATION AND TRIANGULAR WAVE SIGNAL GENERATOR FOR THE SAME

[75] Inventors: Somei Kawasaki, Urawa; Masami Iseki, Yokohama; Hironari Ebata, Yamato, all of Japan

[73] Assignee: Canon Kabushiki Kaisha, Tokyo, Japan

[21] Appl. No.: 70,876

[22] Filed: Jun. 3, 1993

[30] Foreign Application Priority Data

| Jun. 5, 1992 | [JP] | Japan | 4-145693 |
| Jun. 5, 1992 | [JP] | Japan | 4-145694 |
| Oct. 13, 1992 | [JP] | Japan | 4-274319 |
| Oct. 13, 1992 | [JP] | Japan | 4-274320 |
| May 28, 1993 | [JP] | Japan | 5-127503 |
| May 28, 1993 | [JP] | Japan | 5-127504 |

[51] Int. Cl.$^6$ ................................ H03K 4/06
[52] U.S. Cl. .......... 332/109; 331/111; 331/143; 327/74; 327/131; 327/132; 327/137; 327/140; 327/175; 327/261; 358/448; 358/443; 358/455
[58] Field of Search ................ 307/228, 263, 307/265; 332/109; 328/181, 183, 184, 185, 55; 331/111, 143; 345/148, 208; 327/261, 262, 263, 175, 134, 131, 132, 133, 137, 140, 172, 74; 341/142; 358/443, 448, 456, 455, 465, 466, 469

[56] References Cited

U.S. PATENT DOCUMENTS

| 3,893,036 | 7/1975 | Cavoretto et al. | 328/186 X |
| 4,220,927 | 9/1980 | Austin | 328/181 |
| 4,449,061 | 5/1984 | Yasuda et al. | 307/268 |
| 4,870,499 | 9/1989 | Suzuki et al. | 358/456 |
| 4,897,734 | 1/1990 | Sato et al. | 332/109 |
| 4,999,718 | 3/1991 | Arai | 358/455 |
| 5,045,800 | 9/1991 | Kung | 307/265 X |
| 5,119,045 | 6/1992 | Sato | 332/109 |
| 5,283,515 | 2/1994 | Jordan | 323/288 |
| 5,291,562 | 3/1994 | Hata | 332/109 X |
| 5,394,020 | 2/1995 | Nienaber | 327/140 |

FOREIGN PATENT DOCUMENTS

| 0022611 | 1/1991 | Japan | 307/265 |
| 4140914 | 5/1992 | Japan | 332/109 |
| 4170219 | 6/1992 | Japan | 327/175 |
| 2083309 | 3/1982 | United Kingdom | 327/131 |

OTHER PUBLICATIONS

"Plan A Programmable Pulse Generator . . ." by H. Ristad, Electronic Design #8, pp. 84–87, Apr. 12, 1978.

Primary Examiner—Robert J. Pascal
Assistant Examiner—Arnold Kinkead
Attorney, Agent, or Firm—Fitzpatrick, Cellar, Harper & Scinto

[57] ABSTRACT

A triangular wave generator circuit having a triangular wave generator unit for generating a triangular wave signal, and a comparator for comparing the generated triangular wave signal with a predetermined level. The triangular wave generator unit controls the generated triangular wave signal in accordance with the comparison result by the comparator.

44 Claims, 33 Drawing Sheets

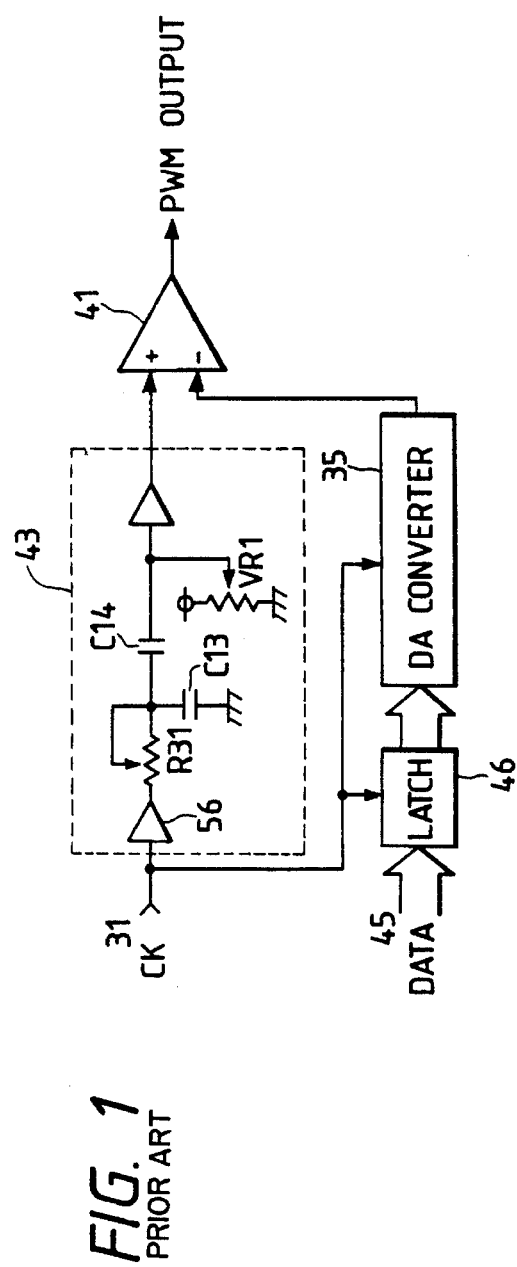
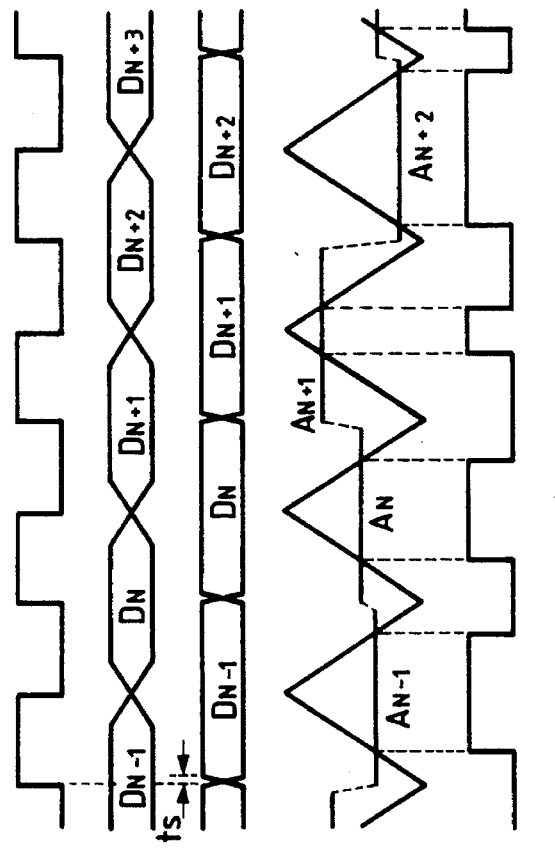
FIG. 1 PRIOR ART
FIG. 2(a) PRIOR ART
FIG. 2(b) PRIOR ART
FIG. 2(c) PRIOR ART
FIG. 2(d) PRIOR ART
FIG. 2(e) PRIOR ART

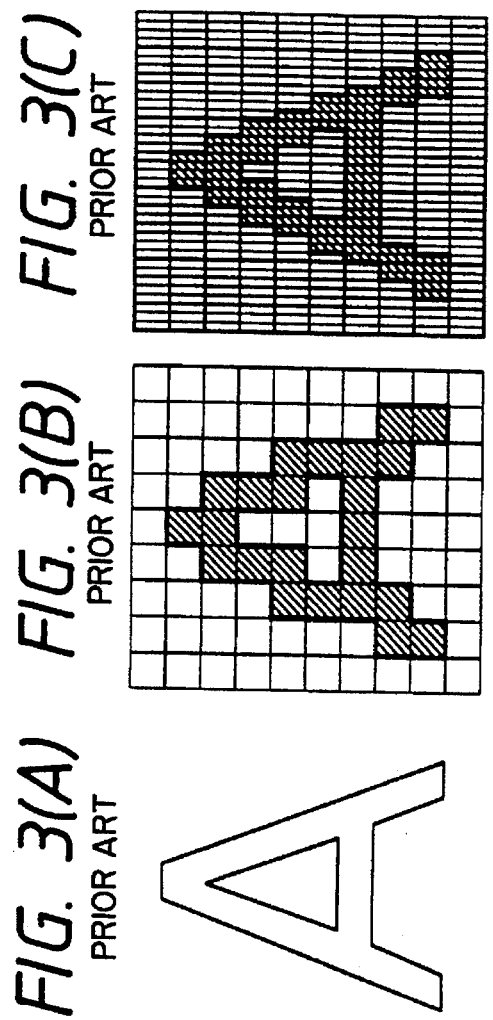
FIG. 3(A) PRIOR ART
FIG. 3(B) PRIOR ART
FIG. 3(C) PRIOR ART
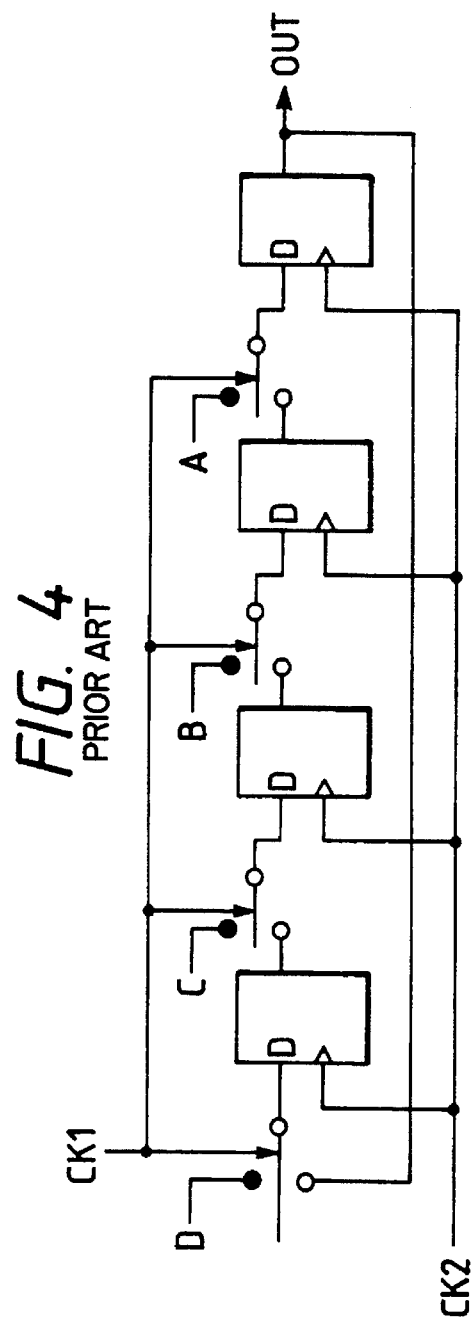
FIG. 4 PRIOR ART FIG. 6
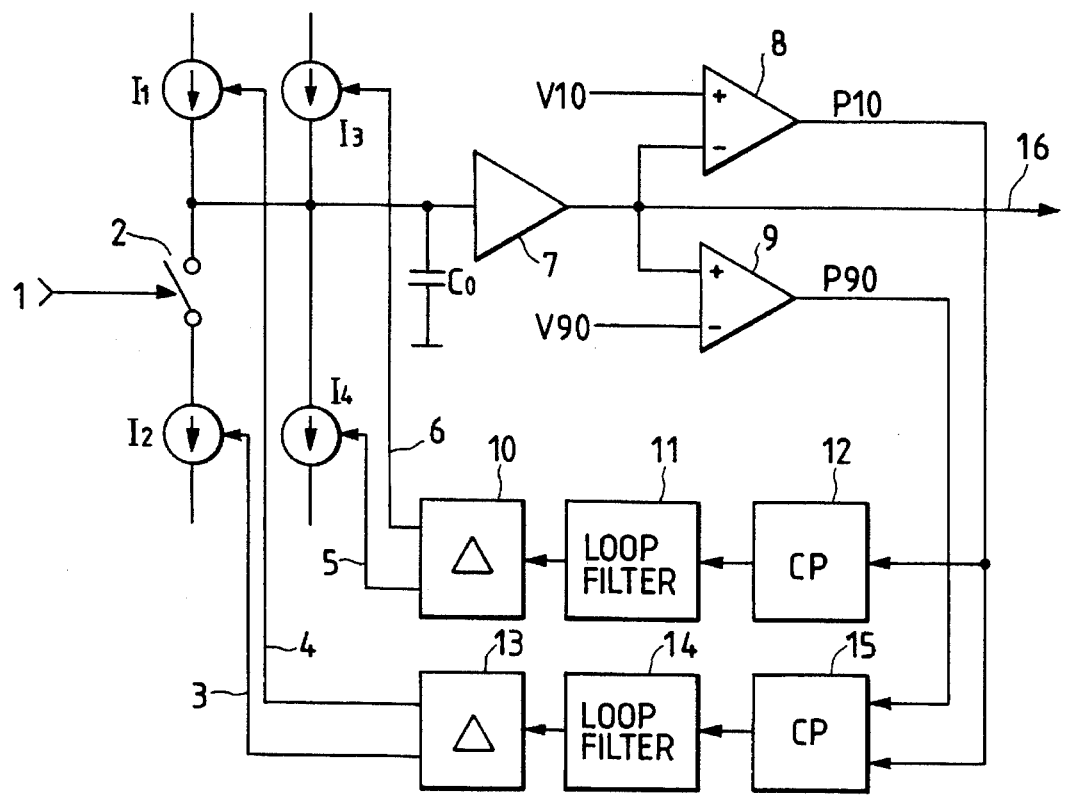
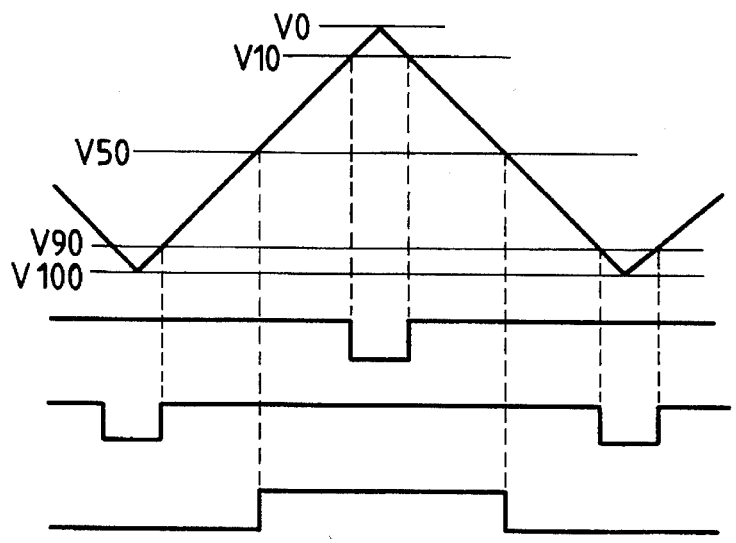
FIG. 7(a)
FIG. 7(b)
FIG. 7(c)
FIG. 7(d)

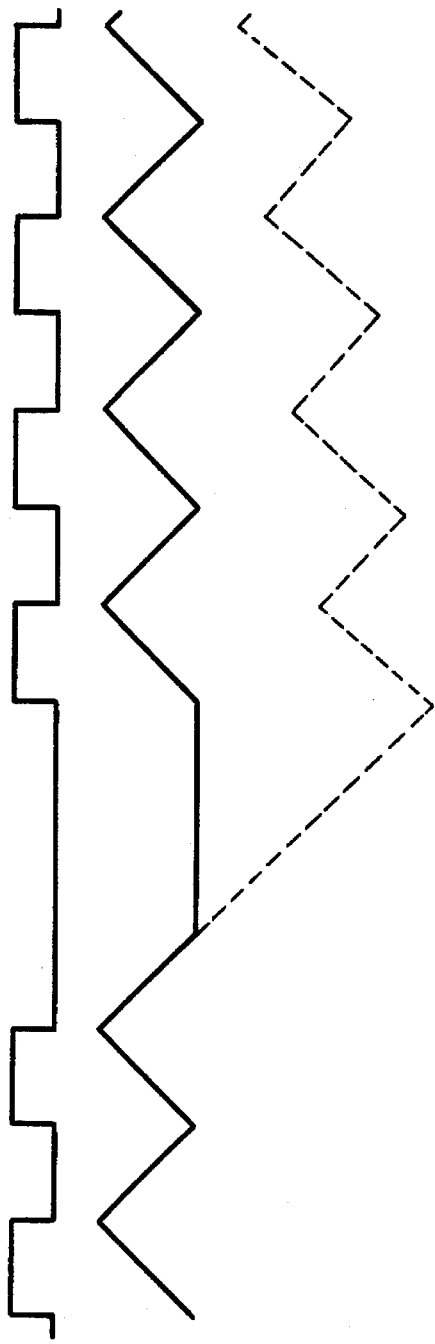
FIG. 13(a)
FIG. 13(b)
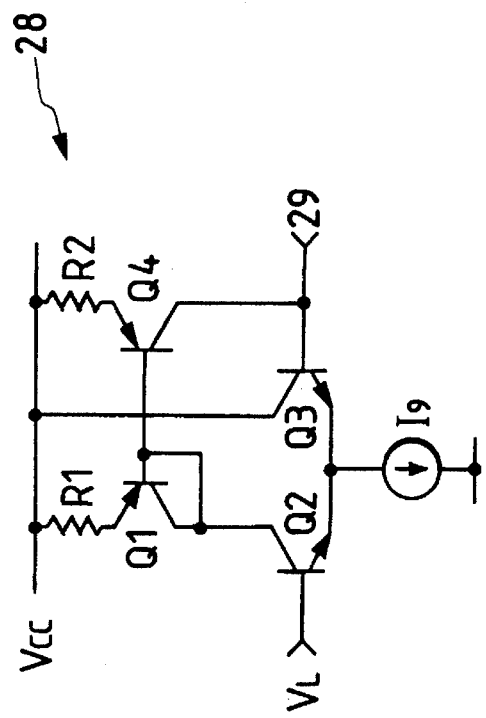
FIG. 14

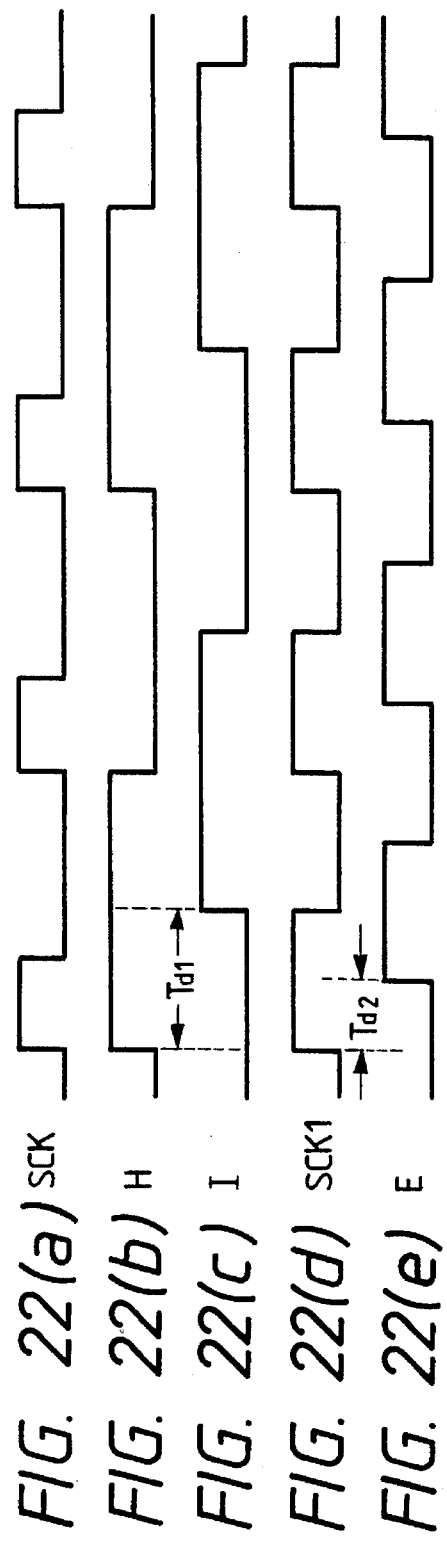
FIG. 22(a) SCK
FIG. 22(b) H
FIG. 22(c) I
FIG. 22(d) SCK1
FIG. 22(e) E
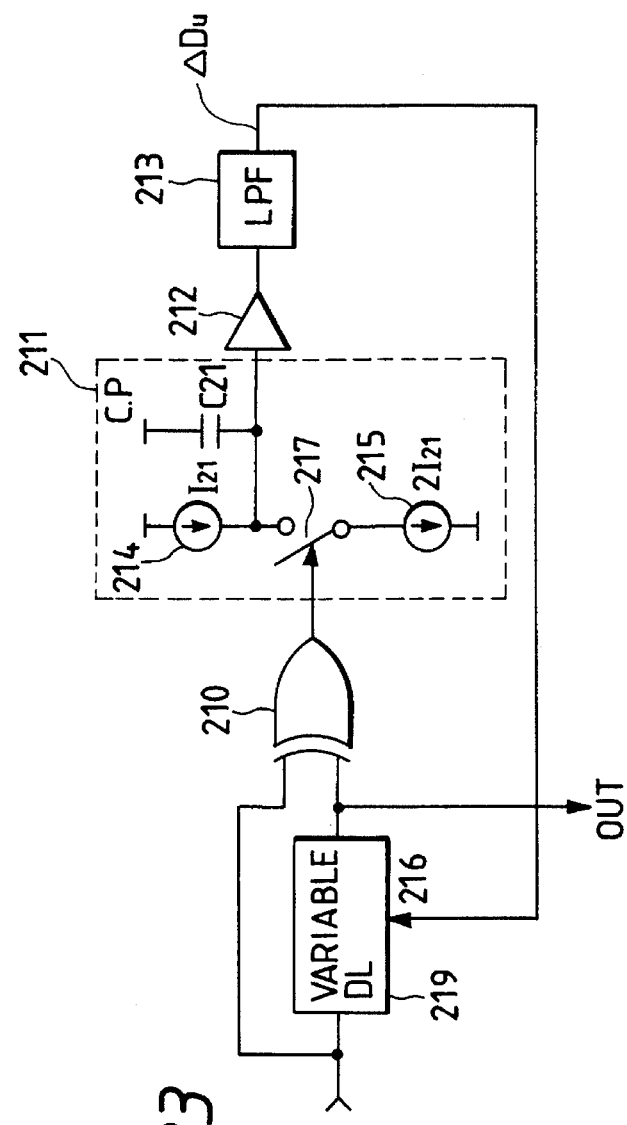
FIG. 23

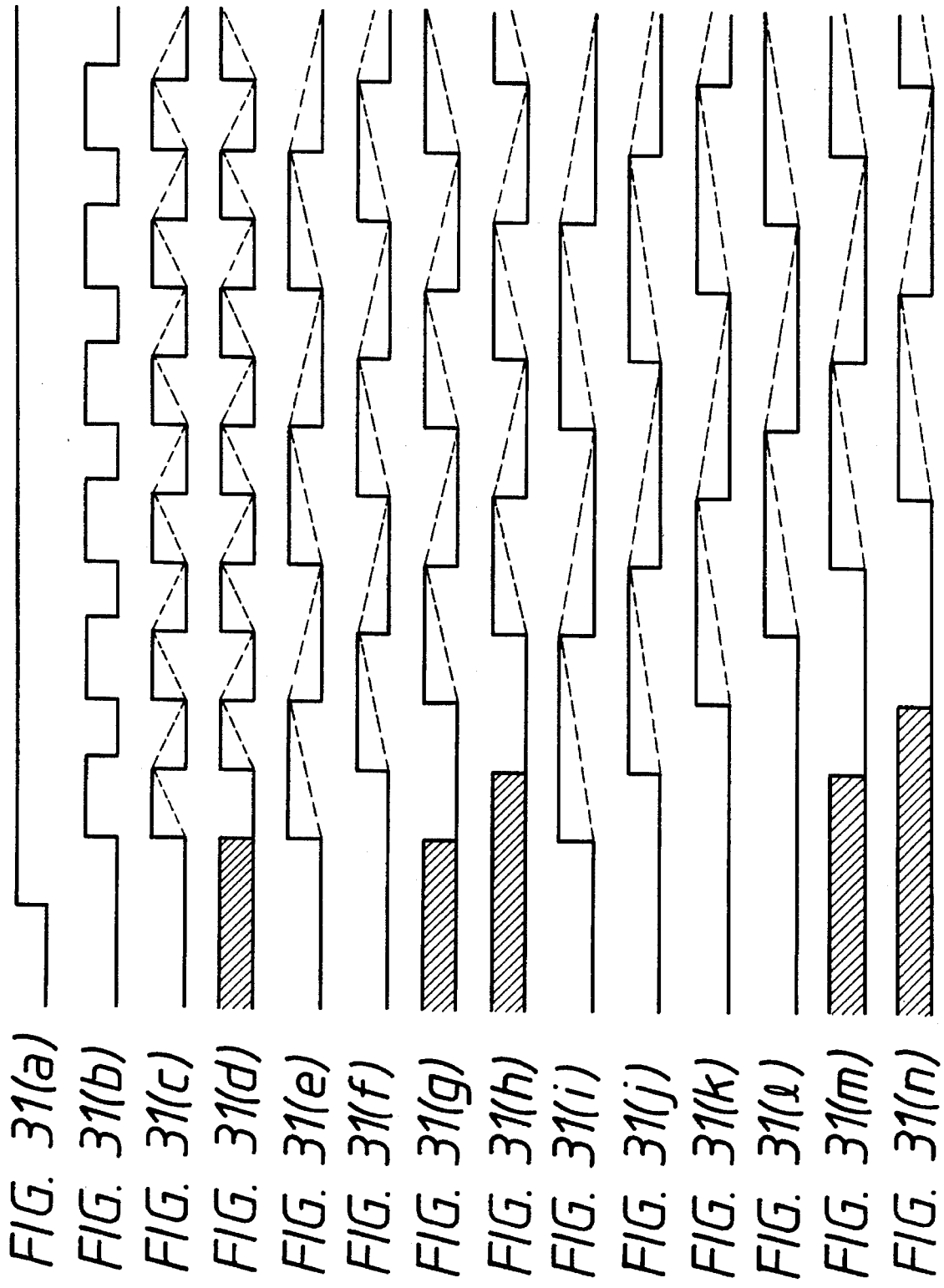

FIG. 33(a)

| M1 | SINGLE PIXEL MODULATION CLOCK PHASE |
|---|---|
| 0 | 0° |
| 1 | 180° |

FIG. 33(b)

| M3 | M2 | TWO TIMES PIXEL MODULATION CLOCK PHASE |
|---|---|---|
| 0 | 0 | 0° |
| 0 | 1 | 90° |
| 1 | 1 | 180° |
| 1 | 0 | 270° |

FIG. 33(c)

| M4 | M3 | M2 | THREE TIMES PIXEL MODULATION CLOCK PHASE |
|---|---|---|---|
| 0 | 0 | 0 | 0° |
| 0 | 0 | 1 | 60° |
| 0 | 1 | 0 | 120° |
| 0 | 1 | 1 | 180° |
| 1 | 0 | 0 | 240° |
| 1 | 0 | 1 | 300° |
| 1 | 1 | 0 | 120° |
| 1 | 1 | 1 | 180° |

FIG. 35(C) PW M MODE
FIG. 35(D) PWM+COMPULSIVE HL MODE

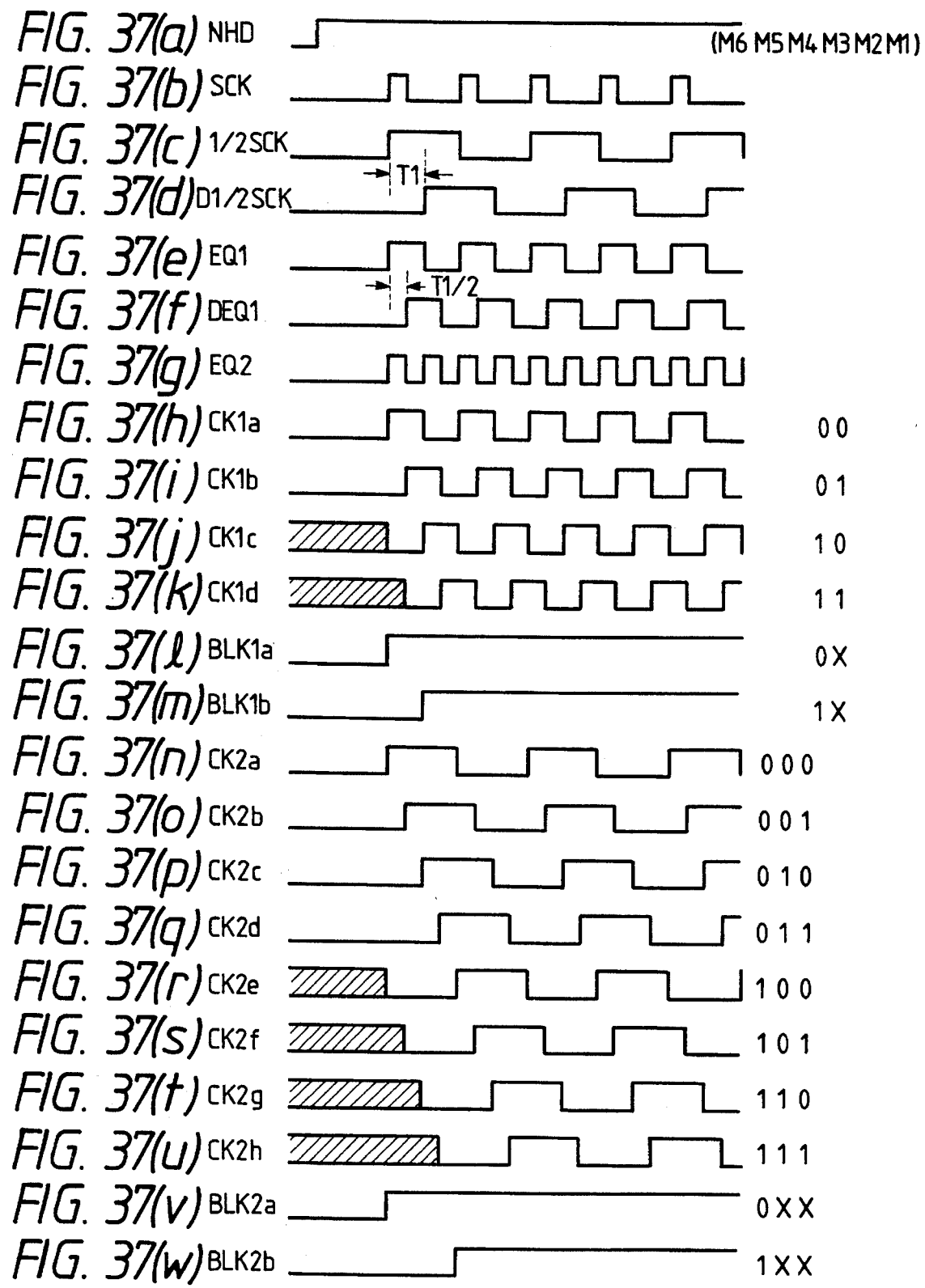

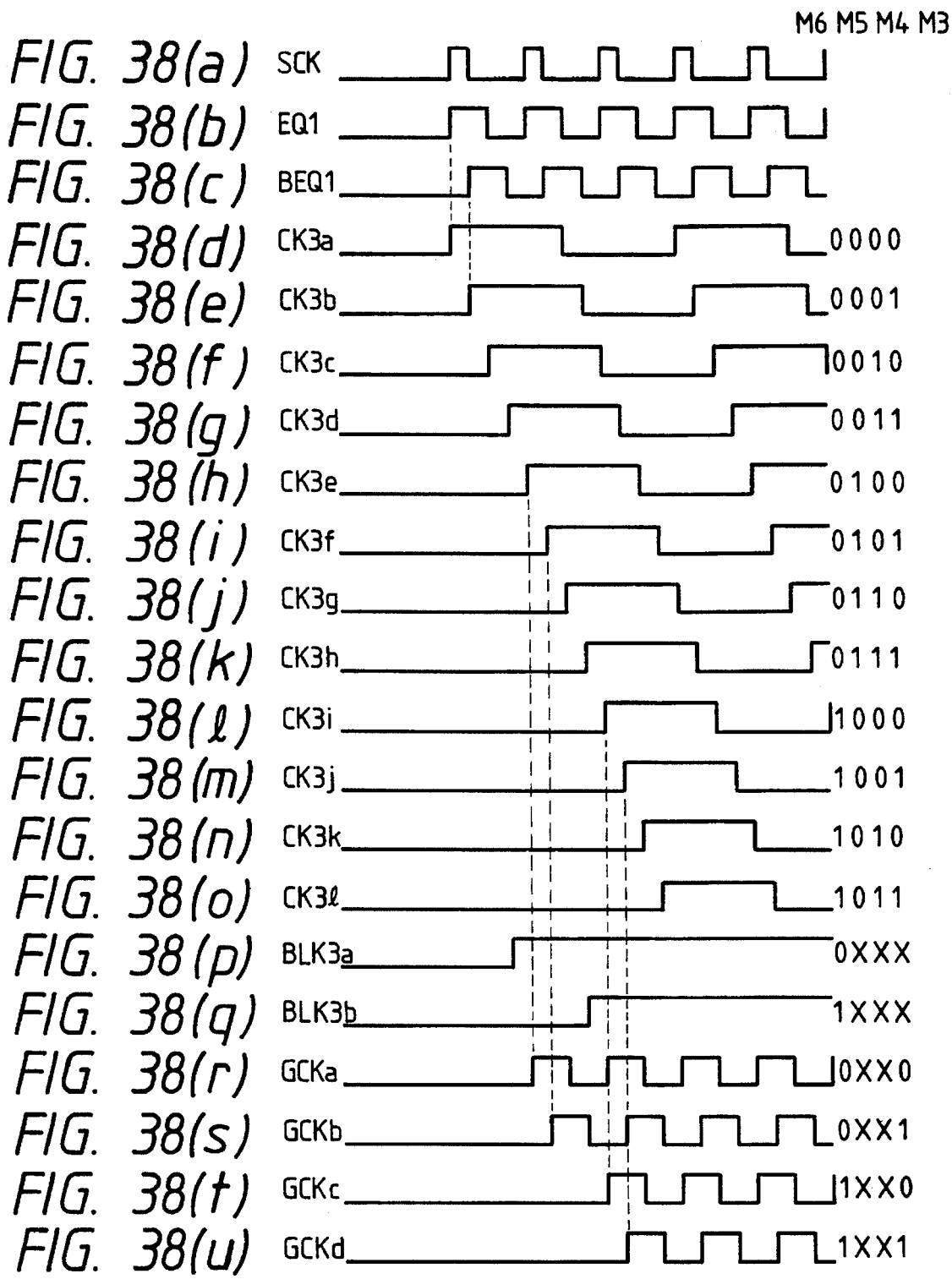

FIG. 39(c)

| MODE | | | | THREE TIMES PIXEL MODULATION CLOCK PHASE |
|---|---|---|---|---|
| M3 | M4 | M5 | M6 | |
| 0 | 0 | 0 | 0 | 0° |
| 1 | 0 | 0 | 0 | 22.5° |
| 0 | 1 | 0 | 0 | 45° |
| 1 | 1 | 0 | 0 | 67.5° |
| 0 | 0 | 1 | 0 | 90° |
| 1 | 0 | 1 | 0 | 112.5° |
| 0 | 1 | 1 | 0 | 135° |
| 1 | 1 | 1 | 0 | 157.5° |
| 0 | 0 | 0 | 1 | 180° |
| 1 | 0 | 0 | 1 | 202.5° |
| 0 | 1 | 0 | 1 | 225° |
| 1 | 1 | 0 | 1 | 247.5° |
| 0 | 0 | 1 | 1 | 270° |
| 1 | 0 | 1 | 1 | 292.5° |
| 0 | 1 | 1 | 1 | 315° |
| 1 | 1 | 1 | 1 | 337.5° |

FIG. 39(b)

| MODE | | | TWO TIMES PIXEL MODULATION CLOCK PHASE |
|---|---|---|---|
| M3 | M4 | M5 | |
| 0 | 0 | 0 | 0° |
| 1 | 0 | 0 | 45° |
| 0 | 1 | 0 | 90° |
| 1 | 1 | 0 | 135° |
| 0 | 0 | 1 | 180° |
| 1 | 0 | 1 | 225° |
| 0 | 1 | 1 | 270° |
| 1 | 1 | 1 | 315° |

FIG. 39(a)

| MODE | | SINGLE PIXEL MODULATION CLOCK PHASE |
|---|---|---|
| M1 | M2 | |
| 0 | 0 | 0° |
| 1 | 0 | 90° |
| 0 | 1 | 180° |
| 1 | 1 | 270° |

PULSE WIDTH MODULATION SIGNAL GENERATION AND TRIANGULAR WAVE SIGNAL GENERATOR FOR THE SAME

BACKGROUND OF THE INVENTION

1. Field of the Invention

The present invention relates to an apparatus for generating a pulse width modulation signal having, for example, a pulse width corresponding to an image gradation degree.

The present invention relates to a triangular wave signal generating apparatus used with a pulse width modulation signal generator or the like.

The present invention relates to a pixel modulation circuit capable of modulating a pixel in response to clocks having a period shorter than pixel clocks.

2. Related Background Art

A PWM pixel modulation method for a laser beam printer (LBP) is known in the art whereby a laser beam radiation time is controlled for each pixel to obtain a light amount correlated to the printing density (deposited toner amount) suitable for a highly fine (high gradation) video image.

FIG. 1 illustrates such pixel modulation. A video clock (FIG. 2(a)) representing a pixel unit and synchronizing with a beam detect (BD) pulse indicating a horizontal reference position of a printing sheet, is inputted to an input terminal 31. The video clock signal is converted into a triangular wave (FIG. 2(d)) synchronously with the video clock signal, and the triangular wave signal is supplied to a comparator 41. Pixel data (FIGS. 2(b)) of eight bits for example is inputted to an input terminal 45, the pixel data being used for determining the printing density of each pixel. The input pixel data is latched (FIG. 2(c)) by a latch 46 in response to the video clock. An output of the latch 46 is converted into an analog voltage (FIG. 2(d)) by a D/A converter 35, the analog voltage being supplied to a comparator 41. As shown in FIG. 2(d), the comparator 41 compares the input triangular wave signal with the pixel analog voltage to output a laser drive pulse (FIG. 2(e)) pulse-width-modulated in accordance with the density of pixel data.

A laser beam is radiated, for example, while the laser drive pulse takes an H level. Therefore, pixel data DN+2 corresponds to a "deep pixel", and pixel data DN corresponds to a "light shaded pixel". The printing density is very sensitive to a pulse width (radiation time). For a high image quality, it is therefore necessary not only to be able to change the peak level value and d.c. offset value of a triangular wave in accordance with the environmental conditions, but also to make the triangular wave stable.

In the triangular wave generator circuit 43 shown in FIG. 1, the video clock is shaped by a buffer 56 to eliminate noises such as ringing, and transformed into a triangular wave by a time constant circuit having a time constant T=R31 * C13 larger than the clock period.

The level of the triangular wave can be set by the resistance value of R31, and the d.c. offset can be set by VR1 with a sufficiently large capacitance of C14. In order to ensure the linearity of the triangular wave slope, it is necessary to set the time constant T about three times the video clock period.

The triangular wave generator circuit shown in FIG. 1 has the following demerits.

1) Since the duty of an input clock signal is not definite, it is necessary to generate clock signals having a period at least two times as high as that of original video clocks. This necessitates an expensive crystal oscillator operating at a higher frequency, for an LBP system expected to operate inherently at high speed for the highly fine printing.

2) The level of a triangular wave signal is required to be at least about 0.6 to 0.7 Vpp in order to match the output characteristic of a general high speed D/A converter. It is therefore necessary to drive the buffer 56 at a large level of about 12V, which is a disadvantage in configuring an IC.

3) The time constant T for determining the level of a triangular wave changes with an environmental condition. In the pixel modulation for an LBP, the temperature of the circuit is generally monitored, imposing a large load in configuring a PWM pixel modulation system for an LBP.

4) The PWM characteristic is determined by a combination of the level and offset of a triangular wave, making the adjustments of both the level and offset difficult.

A pixel modulation method is also known wherein a pixel is modulated by pixel data in unit of the pixel clock divided by N.

For example, in a digital copier or LBP, an image is represented in units of pixel clocks. FIGS. 3(A) to 3(C) show a character "A" represented by digital signals. FIG. 3(A) shows an ideal character "A", and FIG. 3(B) shows the character "A" represented in units of pixel clocks. As seen from FIG. 3(B), the character "A" has a low resolution and a poor linearity of a sloped line. The improved image quality of the character "A" is shown in FIG. 3(C) in which the pixels are modulated in unit of pixel clocks used with FIG. 3(B) divided by four.

In determining whether each pixel divided by four is black or white, the data of the character "A" shown in FIG. 3(B) is referred to. Namely, if the data of FIG. 3(B) is determined as representing an oblique line, each pixel divided by four is determined as black or white so as to smooth the step of the oblique line.

The modulation operation for the character shown in FIG. 3(C) will be described with reference to the timing chart of FIG. 5. In FIG. 5, CK1 is the same image clock used with the character shown in FIG. 3(B). CK2 represents a clock signal having a frequency four times that of CK1. A to D represent modulation data for modulating each pixel divided by four.

Data A to D represent white or black data of each pixel divided by four, as shown in FIG. 3(C).

For the pixel modulation, four bit parallel data A to D is converted into serial data at the timing of CK2. This parallel/serial conversion is performed by a shift register. FIG. 4 shows a shift register circuit, and FIG. 5 is a timing chart explaining the operation thereof. With the clocks having a frequency four times as high as that of the clocks used for the character shown in FIG. 3(B), and with the four bit modulation data, the character image shown in FIG. 3(C) can be obtained.

The frequency of clocks used for the character shown in FIG. 3(B) becomes higher and higher as the printing speed and image fineness of a digital copier or LBP are improved. The clock frequency used with FIG. 3(C) is four times as high as that used with FIG. 3(B). When the modulation clock frequency becomes in excess of 80 to 100 MHz, there arises a CMOS process limit, i.e., expensive ECL logics and crystal oscillator, leading to a high cost of the apparatus.

SUMMARY OF THE INVENTION

It is an object of the present invention to solve the above-described problems.

It is another object of the present invention to provide a triangular wave signal generating apparatus capable of generating a stable triangular wave signal even under a change in the power source, environmental temperature, and element characteristics, by causing a feedback loop to automatically set the level and offset of a triangular wave signal without manual adjustment, and to provide a PWM modulation apparatus using the triangular wave signal generating apparatus.

It is a further object of the present invention to provide a triangular wave signal generating apparatus capable of generating a triangular wave signal having a good linearity of a slope without using a high power source voltage as in the case of a conventional triangular wave generator, and to provided a PWM modulation apparatus using the triangular wave signal generating apparatus.

It is a still further object of the present invention to provide a triangular wave signal generating apparatus having an excellent activation performance even for sync clocks such as video clocks having a clock missing period and disturbed clock phases before and after the clock missing period, by adding an enabling circuit with a simple structure, and to provide a PWM modulation apparatus using the triangular wave signal generating apparatus.

It is another object of the present invention to provide a triangular wave signal generating apparatus unnecessary to have a controlled duty of an input clock signal and hence unnecessary to have a clock signal having a frequency two times as high as that of the input clock signal, by controlling the offset value of a triangular wave signal by the duty of the input clock signal, and to provide a PWM modulation apparatus using the triangular wave signal generating apparatus.

It is another object of the present invention to provide a stable PWM modulation apparatus in which it is unnecessary to perform fine adjustments and wherein the minimum and maximum pulse widths of a PWM signal output are fully independent and can be adjusted easily without setting an unnecessarily broad adjustment range.

It is another object of the present invention to provide a PWM pixel modulation apparatus stable even under a change in the power source, environmental temperature, and element characteristics, for generating a triangular wave signal by causing a feedback loop to automatically set the level and offset of a triangular wave signal without manual adjustment, and by correlating a D/A converter output voltage to the level and offset.

It is another object of the present invention to provide a PWM pixel modulation apparatus capable of presenting a variety of pixel modulations and a high quality printing image, wherein the unit of pixel modulation can be switched by a mode signal among a single pixel modulation, two-times pixel modulation, and three-times pixel modulation, and the modulation phase can be switched between 0° and 180° for the single pixel modulation, between 0°, 90°, 180°, and 270° for the two-times pixel modulation, and between 0°, 60°, 120°, 180°, 240°, and 300° for the three-times pixel modulation, respectively in units of half the period of the single pixel modulation.

It is a further object of the present invention to provide a system using pixel modulation through N-bit serial-parallel conversion at the timing of a pixel clock period divided by N, wherein the serial-parallel conversion is performed by using a delay circuit having a controlled delay amount and an output of the delay circuit correlated to the delay amount, thereby not requiring clocks having a frequency N times as high as input clocks.

According to the present invention, a triangular wave signal is generated synchronously with an input clock signal by using a capacitor and charging/discharging current sources, alternately charging/discharging the capacitor at the time when the input clock changes its level. The triangular wave signal is compared with a plurality of predetermined potential levels to generate a plurality of pulses. A detector circuit is provided which detects the level and offset of the triangular wave signal by using the pulses and stabilizes when the level and offset values take predetermined values. An error signal outputted from the detector circuit is used to control the current values of the charging/discharging current sources and to obtain a desired triangular wave signal.

According to the present invention, a triangular wave signal is generated synchronously with an input clock signal by using a capacitor and charging/discharging current sources having the same current value, alternately charging/discharging the capacitor at the time when the input clock changes its level, the triangular wave signal is compared with a plurality of predetermined potential levels to generate a plurality of pulses. A detector circuit is provided which detects the level and offset of the triangular wave signal by using the pulses and stabilizes when the level and offset values take predetermined values. An error signal outputted from the detector circuit is used to control the current values of the charging/discharging current sources and the duty of the input clock signal and to obtain a desired triangular wave signal.

According to the present invention, the level and d.c. offset of an output of the triangular wave generator are detected, and the detected results are used to control the D/A converter. An output of the D/A converter is compared with the triangular wave signal to output a PWM signal. Alternatively, the level and d.c. offset of an output of the triangular wave generator are controlled to have predetermined values, and an output of the triangular wave generator correlated to the predetermined values is compared with the triangular wave signal to output a PWM signal.

According to the present invention, there are provided a variable delay circuit for variably delaying the fundamental clock by a desired delay amount, delay amount controlling means for controlling the delay amount of the variable delay circuit, and means for selecting modulation data in accordance with the fundamental clock and the delayed clock from the variable delay circuit, wherein the selecting means selects and outputs the modulation data at the time interval corresponding to the fundamental clock divided by N.

According to the pixel modulation apparatus of the present invention, it is therefore possible to modulate each pixel divided by N with a simple circuit structure using the variable delay circuit without using clocks having a frequency higher than pixel clocks.

It is possible to modulate pixels and obtain a clear image without using clocks having a frequency higher than input pixel clocks.

According to the present invention, N variable delay circuits are added to a pixel modulation system such as shown as the conventional example. The delay amount of the N variable delay circuits is controlled to have T/2 to $T/2^N$ where T is the input clock period. In this manner, the pixel modulation phase shift amount unit can be set easily to ½N of the input clock period.

According to the present invention, triangular wave signal generating means is constructed in the following manner. A triangular wave signal is generated synchronously with an input clock signal by using a capacitor and charging/discharging current sources having the same current value, alternately charging/discharging the capacitor at the time when the input clock changes its level, the triangular wave signal is compared with a plurality of predetermined potential levels to generate a plurality of pulses. A detector circuit is provided which detects the level and offset of the triangular wave signal by using the pulses and stabilizes when the level and offset values take predetermined values. An error signal outputted from the detector circuit is used to control the current values of the charging/discharging current sources and the duty of the input clock signal and to obtain a desired triangular wave signal. A voltage correlated to the level and offset of the triangular wave signal is used to control the D/A converter output so that the D/A converter can be configured to stably output a voltage correlated to the level and offset of the triangular wave signal.

With the triangular wave signal generating means and the D/A converter, it is possible to stably conduct PWM modulation.

Input clock duty controlling means of the triangular wave signal generating means, and a delay circuit correlated with the input clock duty controlling means, are used to set new phases within the pixel clock period to allow parallel/serial conversion without using high frequency clocks.

Other objects, advantages and effects of the present invention will become apparent from the following detailed description, accompanying drawings and appended claims.

BRIEF DESCRIPTION OF THE DRAWINGS

FIG. 1 shows a block diagram showing a conventional PWM signal generator.

FIGS. 2(a) to 2(e) show waveforms explaining the operation of PWM pixel modulation.

FIGS. 3(A) 3(B) and 3(C) show dot images.

FIG. 4 shows an example of a shift register circuit.

FIG. 6 shows a first embodiment of a triangular wave generator circuit.

FIGS. 7(a) to 7(d) show waveforms explaining the operation of the triangular wave signal generator circuit of the first embodiment.

FIGS. 13(a) and 13(b) show waveforms explaining the operation of the third embodiment.

FIG. 14 shows the enabling circuit used by the third embodiment.

FIGS. 22(a) to 22(e) show timing charts explaining the operation of the sixth embodiment.

FIG. 23 is a block diagram of a 90 degree delay circuit.

FIGS. 31(a) to 31(n) show timing charts explaining the operation of the circuit shown in FIG. 30.

FIGS. 33(a) to 33(c) show tables explaining the phase of each clock at respective modes M1 to M4.

FIGS. 35(A) to 35(D) show timing charts explaining the operation of the embodiment shown in FIG. 34.

FIGS. 37(a) to 37(w) and FIGS. 38(a) to 38(u) show timing charts explaining the operation of the embodiment shown in FIG. 36.

FIGS. 39(a) to 39(c) show tables explaining the phases of a single pixel modulation clock, two-times pixel modulation clock, and three-times modulation clock at respective modes.

DETAILED DESCRIPTION OF THE PREFERRED EMBODIMENTS

[First Embodiment]

Figure 5:
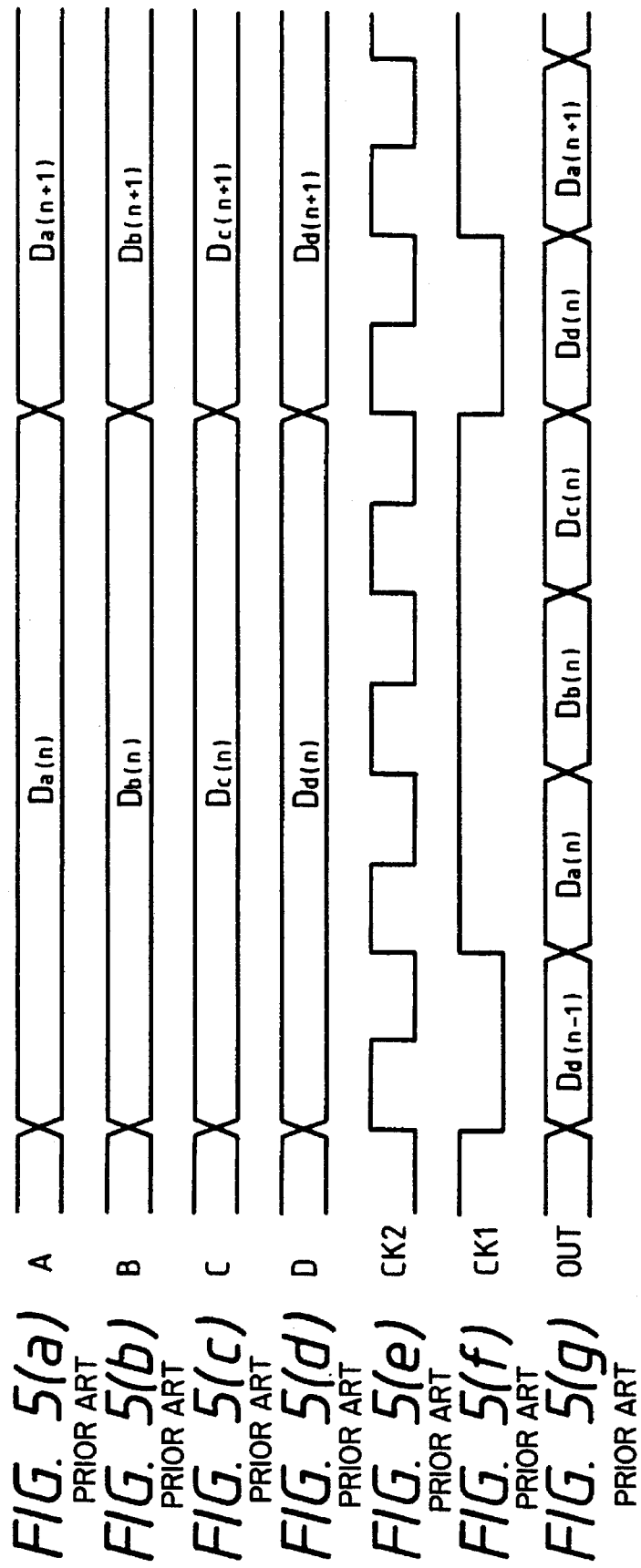
FIGS. 5(a) to 5(g) are timing charts explaining the operation of the circuit shown in FIG. 4.

FIG. 6 shows the first embodiment of a triangular wave generator circuit according to the present invention.

A clock signal such as video clocks is inputted to a terminal 1 to control a switch 2. When the clock signal takes an H level, the switch 2 is turned off to monotonously raise the voltage across a capacitor CO by a charge current I1+(I3–I4). When the clock signal takes an L level, the switch 2 turns on to lower the voltage across the capacitor CO by a discharge current I2–I1–(I3–I4). To obtain a balanced duty ratio, I1 to I4 are controlled to satisfy (I3–I4)=0 and I2 =2 * I1. Since I1 is generated by a circuit made of p-type transistors which are not suitable for a high speed switching operation, I2 is set to a twofold of I1. One period of a triangular wave is generated during one period of clocks. If I1 to I4 are not controlled but to set to fixed values, the level of a generated triangular wave and the offset value fluctuate because of a change in the values of the capacitor CO, current source elements for I1 to I4, and clock duty.

To solve this problem, the generated triangular wave is supplied via a buffer 7 to the inverting terminal of a comparator 8 and the non-inverting terminal of another comparator 9. Reference voltages V10 and V90 are applied to the non-inverting and inverting terminals of the comparators 8 and 9 so that a pulse having a duration of 90% of the period of an ideal triangular wave is outputted from both the comparators 8 and 9 as shown in FIGS. 7(a) to 7(d). The pulses outputted from the comparators 8 and 9 are shown in FIGS. 7(b) and 7(c). These pulses are inputted to charge pump circuits 12 and 15.

Figure 8:
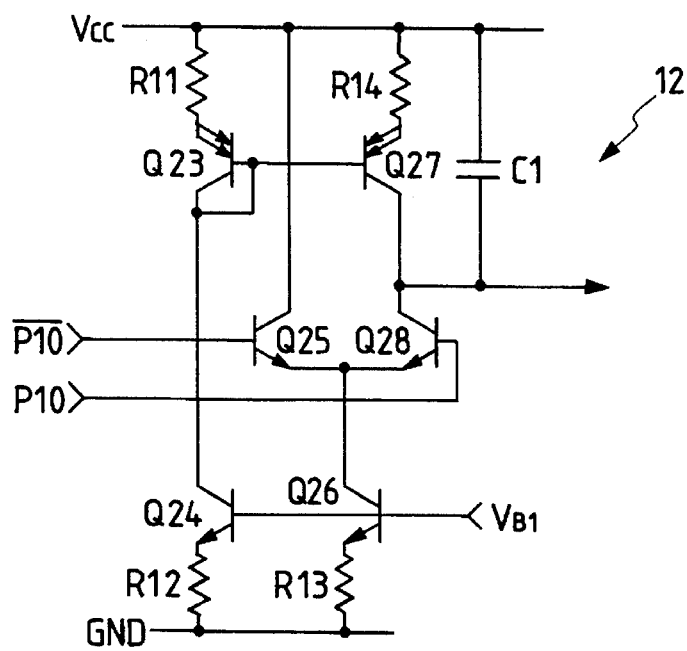
FIG. 8 shows the charge pump circuit 12 used by the first embodiment.

The pulse outputted from the comparator 8 is inputted to the charge pump circuit 12 illustratively shown in FIG. 8. When the conditions that, $Q24_{emitter\ size}=Q26_{emitter\ size}$, 9, $Q23_{emitter\ size}=10 * Q27_{emitter\ size}$, R12=R13, and 10 * R11=9 * R14 are satisfied, the average values of the charge and discharge currents flowing through a capacitor C1 become the same only when the L level duration of the pulse P10 becomes 10% of the triangular signal period, setting the output voltage of the charge pump circuit 12 to an equilibrium state.

The output of the charge pump circuit 12 is inputted to a loop filter 11 to undergo a suitable filtering operation. The output of the loop filter 11 is supplied to an error signal generator circuit 10 to generate error signals 5 and 6 which control the current sources I4 and I3, respectively. When the output pulse width of the comparator 8 is more than 90%, the value (I3–I4) increases, and when it is less than 90%, the value decreases. In this manner, the absolute value of (I3–I4) and the polarity are controlled to converge the output pulse of the comparator 8 to a duration of 90% of the triangular wave period.

Figure 9:
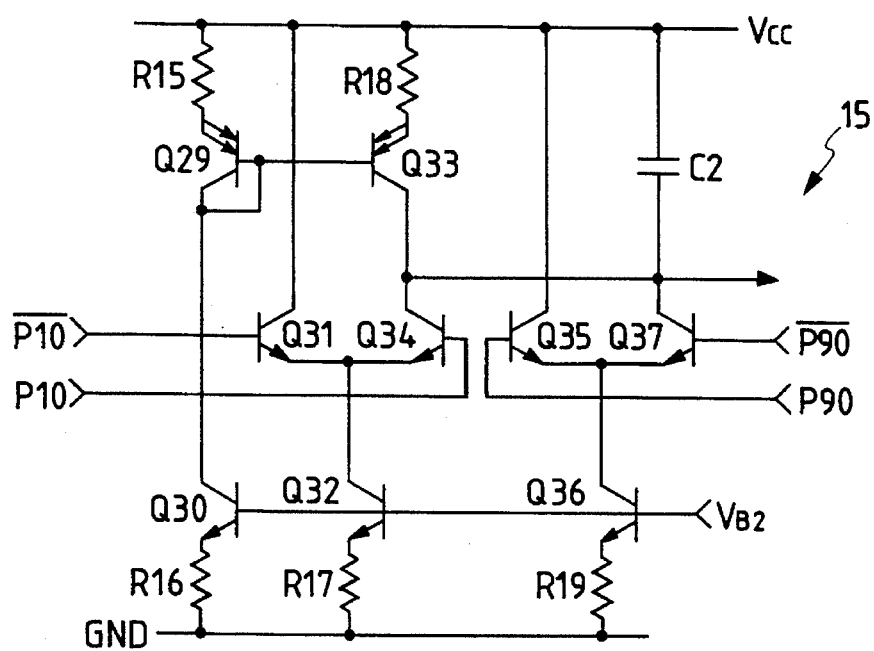
FIG. 9 shows the charge pump circuit 15 used by the first embodiment.

The output pulses of the comparators 8 and 9 are inputted to the charge pump circuit 15 illustratively shown in FIG. 9. When the conditions that 5 * $Q29_{emitter\ size}=9$, * $Q33_{emitter\ size}$, $Q33_{emitter\ size}=Q32_{emitter\ size}=Q36_{emitter\ size}$, $Q31_{emitter\ size}=Q37_{emitter}$ 9 * R15=5 * R18, and R16=R17=R19 are satisfied, a current flowing through Q33 becomes 1.8 times the current flowing when Q34 and Q37 turn on.

Therefore, only when the sum of the L level durations of the output pulses P10 and P90 of the comparators 8 and 9 becomes 20% of the triangular wave signal period, the sum of charge and discharge currents of a capacitor C2 is set to an equilibrium state, stabilizing the output voltage of the charge pump circuit 15. Similar to the charge pump circuit 12, the output of the charge pump circuit 15 is supplied to a loop filter 14 whose output is supplied to an error signal generator circuit 13 to generate error signals 3 and 4. The error signals 3 and 4 control the current sources I1 and I2 to proportionally regulate their current values. When the sum of the output pulse widths of the comparators 8 and 9 is more than 180%, the values I1 and I2 increase, and when it is less than 180%, the value decreases. In this manner, the sum of the output pulse widths of the comparators 8 and 9 is converged to 180%, so that the triangular wave generator circuit shown in FIG. 6 generates the ideal triangular wave shown in FIG. 7(a). The charge pump circuit 15 determines the triangular wave level, and the charge pump circuit 12 determines the offset value of the triangular wave. In the above embodiment, the offset level of the triangular wave is controlled by the output pulse of a narrow width (10%) of the PWM pixel modulator. This is because the image quality of an LBP system using a PWM pixel modulator is affected greatly by pixels corresponding to narrow output pulses (light shaded pixels). It is however obvious that the invention is not limited to this embodiment wherein reference voltages V10 and V90 are used for the control of the triangular wave.

[Second Embodiment]

Figure 10:
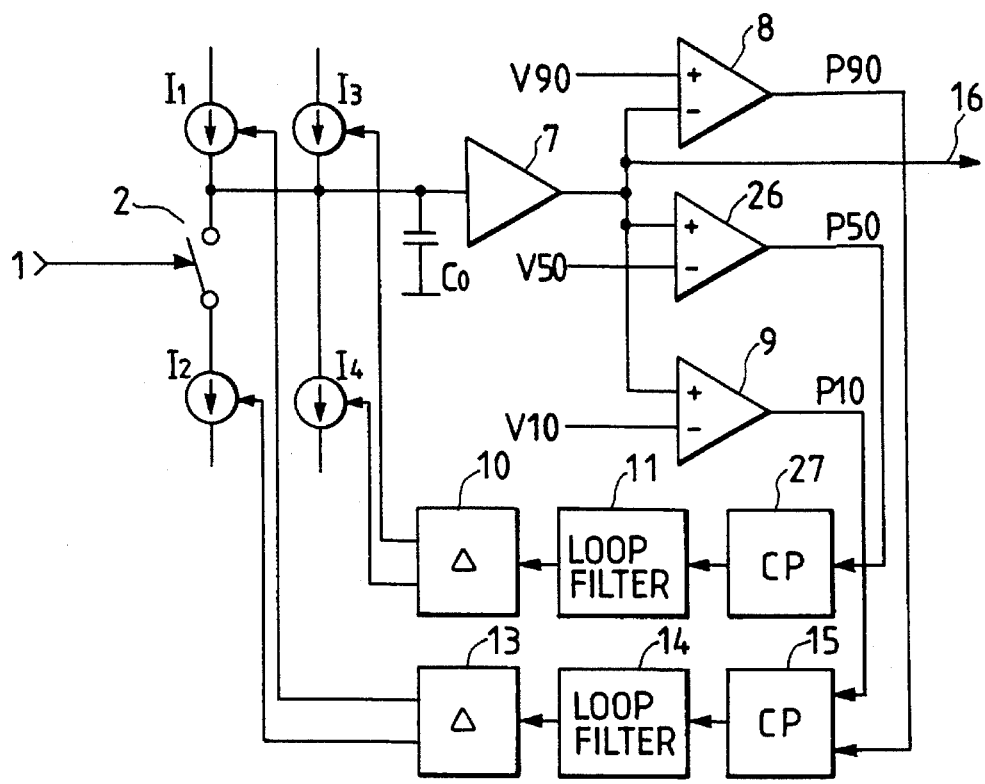
FIG. 10 shows a second embodiment of the triangular wave generator circuit.
Figure 11:
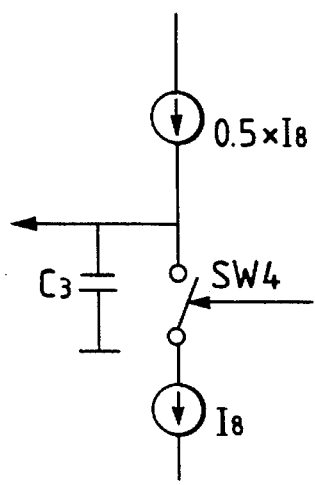
FIG. 11 shows as equivalent circuit of the charge pump circuit of the second embodiment.

FIG. 10 shows the second embodiment of a triangular wave generator circuit according to the present invention, wherein the offset value of the triangular wave is controlled at the median level of the triangular signal. In FIG. 10, elements those providing the same function as the embodiment shown in FIG. 6 are represented by using identical reference numerals. In the following, only the different points from the triangular wave generator circuit shown in FIG. 6 are described. In this triangular wave generator circuit shown in FIG. 10, a generated triangular wave is inputted to the non-inverting input terminal of another comparator 26, and a reference voltage V50 is inputted to the inverting input terminal of the comparator 26 so that a pulse signal having a duration of 50% of the ideal triangular wave is outputted from the comparator as shown in FIGS. 7(a) and 7(d). The output of the comparator 26 is supplied to a charge pump circuit 27 whose equivalent circuit is shown in FIG. 11. A switch SW4 turns on when the output pulse of the comparator 26 takes the H level. A constant current source I8 is connected to one contact of the switch SW4, and a constant current source 0.5 * I8 and a capacitor C3 are connected to the other contact of the switch SW4. Therefore, only when the output pulse of the comparator 26 has a duration of 50% of the triangular wave, the output voltage of the charge pump circuit 27 is stabilized.

The output of the charge pump circuit 27 controls the value of (I3–I4). When the output pulse of the comparator 26 has a duration more than 50%, the value (I3–I4) decreases, and when the output pulse has a duration less than 50%, the value (I3–I4) increases, to converge the output wave into a desired triangular wave.

In the embodiment shown in FIG. 10, by properly setting the reference voltage V50 applied to the comparator 26 and the charge pump circuit 27, the offset value can be arbitrarily set independently from the level of the triangular wave.

[Third Embodiment]

Figure 12:
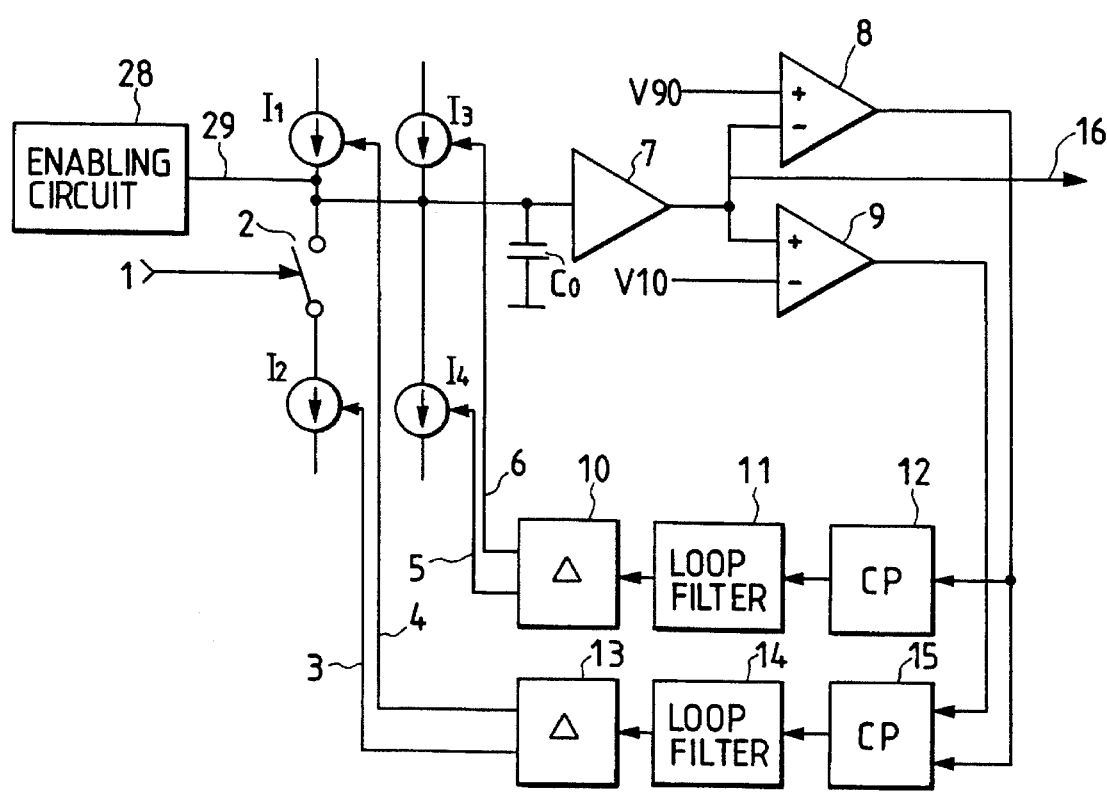
FIG. 12 shows a third embodiment of the triangular wave generator circuit.

FIG. 12 shows the third embodiment of a triangular wave generator circuit according to the present invention. The different point from the triangular wave generator circuit shown in FIG. 6 is an addition of an enabling circuit 28. In the PWM pixel modulation of an LBP system, it is necessary to generate a triangular wave signal shown by a solid line in FIG. 13(b) from an intermittent video clock signal having a clock missing period with a disturbed phase, as shown in FIG. 13(a). With the triangular wave generator circuit shown in FIG. 6, the potential of the triangular wave lowers during the clock missing period as shown by the broken line in FIG. 13(b), being unable to obtain a desired triangular wave immediately after the clock missing period. The enabling circuit 28 is provided so as to suppress the lowering of the potential of the triangular wave during the clock missing period as much as possible and to obtain the desired triangular wave like that shown by the solid line in FIG. 13(b). An example of the enabling circuit 28 is shown in FIG. 14. A constant current source I9 flows a current having a value larger than I2–I1–(I3–I4). A current mirror circuit constructed of current switches Q2 and Q3, transistors Q1, Q4, and resistors R1, R2 (Q1 emitter size=Q2 emitter size, R1=R2), supplies a charge current to a terminal 29. A potential V100 at the lower peak of the triangular wave or VL slightly lower than V100 shown in FIG. 7(a) is inputted to the base of the transistor Q2, and the terminal 29 is connected to the current source I1. When the triangular wave lowers VL, the transistor Q2 turns on to supply the charge current to the terminal 29 so that the potential lowering of the triangular wave during the clock missing period is suppressed to fix the potential near at VL.

[Fourth Embodiment]

Figure 15:
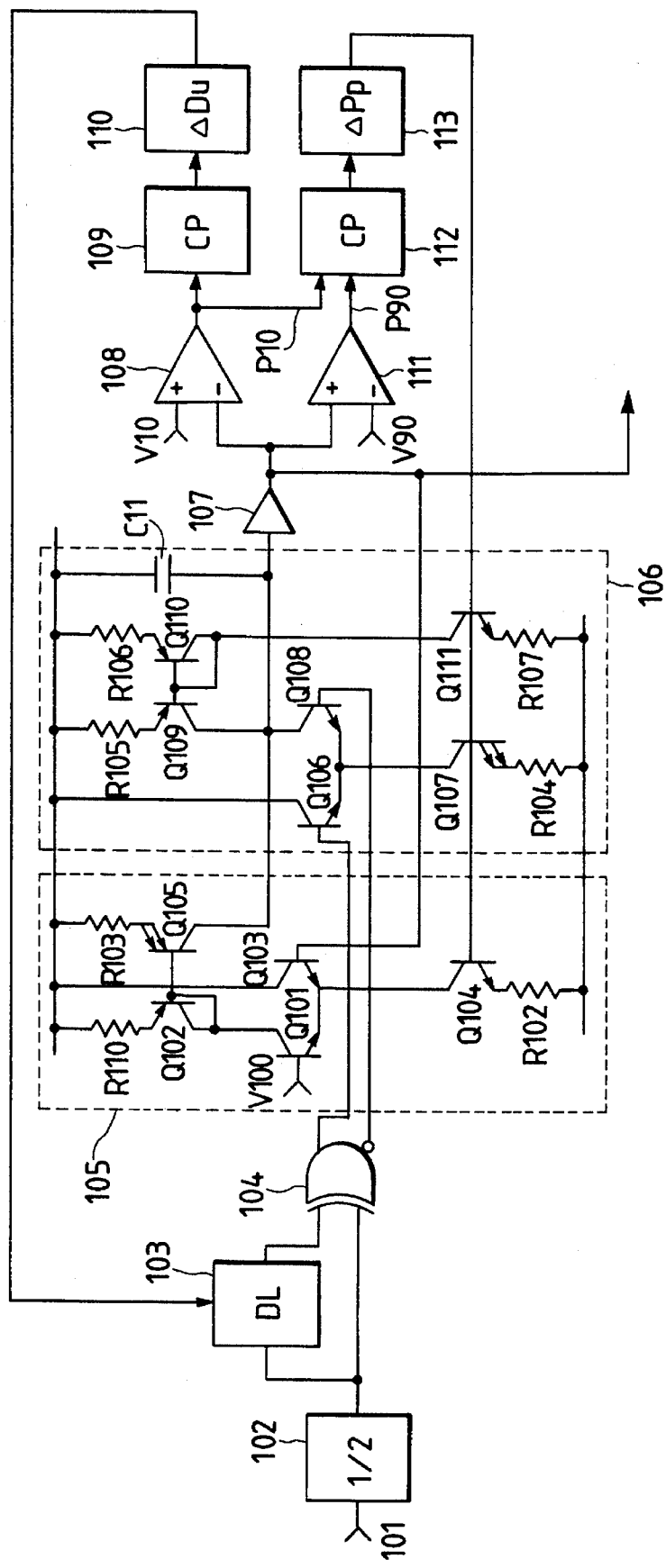
FIG. 15 shows a fourth embodiment of the triangular wave signal generator circuit.
Figure 17A:
FIGS. 17(a) to 17(d) show timing charts explaining the operation of the circuit shown in FIG. 14.
Figure 17B:
Figure 17C:
Figure 17D:

FIG. 15 shows the fourth embodiment of a triangular wave generator circuit according to the present invention. A synchronizing clock signal is inputted to a terminal 101. This synchronizing clock signal such as video clocks of LBP having missing clocks at certain timings and having disturbed phases. Since the duty ratio of an inputted clock signal is indefinite, it is first necessary to reproduce the duty. A clock signal with a shifted duty ratio such as shown in FIG. 17(a) is first frequency divided into a signal shown in FIG. 17(b). The frequency-divided clock signal is inputted to a variable pulse delay circuit 103 to output a delayed clock signal shown in FIG. 17(c). This delayed clock signal and non-delayed clocks signal are inputted to an exclusive OR gate circuit 104 which outputs a clock signal shown in FIG. 17(d). If the delay time of the variable pulse delay circuit 103 is set to half the input clock signal period, a clock signal with its duty ratio reproduced is outputted from the exclusive gate circuit 104.

This clock signal is inputted to a triangular wave generator unit 106. This unit is similar to the first embodiment, whose elements are set such that Q106=Q108, 2 * Q111= Q107, Q109=Q110, 2 * R104=R107, R105=R106, where an equal sign between transistors indicates the relationship between the emitter sizes of the transistors. Both the charge and discharge currents flowing through a capacitor C11 become equal, and the charge discharge operations are switched by the transistor Q108 to generate a triangular wave signal. This signal is inputted via a buffer 107 to comparators 108 and 111. The triangular wave signal is inputted to the inverting input terminal of the comparator 108, and a voltage V10 defining a 10% level lower than the upper peak of the triangular wave signal is inputted to the non-inverting terminal as shown in FIG. 7(a).

A 10% duration negative pulse shown in FIG. 7(b) is outputted from the comparator 108 assuming that the peak and offset values take the rating values. The triangular wave signal is applied to the non-inverting terminal of the comparator 111, and a voltage V90 defining a 10% level higher than the lower peak of the triangular wave signal is inputted to the inverting input terminal. Assuming also that the peak and offset values take the rating values, a 10% duration negative pulse shown in FIG. 7(c) is outputted from the comparator 111. The two pulses are inputted to a charge pump circuit 112 like the charge pump circuit 15 shown in FIG. 9.

Only when the sum of the L level durations of output pulses P10 and P90 of the comparators becomes 20% of the triangular wave signal period, the sum of the charge and discharge currents flowing through the capacitor C2 is set to stabilize the output voltage of the charge pump circuit 112. The slope of the triangular wave signal generated by only the charge and discharge currents flowing through the capacitor C11 in the triangular wave generator unit 106 is linear, so that the peak value of the triangular wave signal takes a desired rating value under the equilibrium state of the charge pump circuit 112.

An output of the charge pump circuit 112 is supplied to a peak error generator circuit 113 to generate a peak error. This peak error controls the charge/discharge current of the triangular wave signal generator unit 106. For example, if the peak value of the triangular wave signal is larger than the rating value, the output voltage of the charge circuit 112 rises, so that the output voltage of the peak error generator circuit 113 lowers to lower the peak level value of the triangular signal. On the other hand, if the peak value of the triangular wave signal is small, the output voltage of the charge pump circuit 111 lowers to raise the peak error signal voltage and increase the peak level value of the triangular wave signal to converge it to the rating value.

An output of the comparator 108 is inputted to the charge pump circuit 109 which is similar to the charge pump circuit 12 (FIG. 8). The average values of charge and discharge currents for the capacitor $C_1$ become equal only when the L level duration of the pulse P10 becomes 10% of the triangular signal period, thereby stabilizing the output voltage of the charge pump circuit 109. If the duty ratio of the clock signal inputted to the triangular signal generator unit 106 is not correct, the offset voltage of the triangular signal becomes unstable and the charge pump circuit 109 will not equilibrate because the charge and discharge currents supplied to the capacitor $C_1$ are equal.

An output of the charge pump circuit 109 is supplied to an offset error generator circuit 110 to generate an offset error signal. This signal is supplied to the variable pulse delay circuit 103 to control the clock duty by regulating the delay time of the inputted pulse. The control of the clock duty determines the offset voltage of the triangular wave signal.

Figure 16:
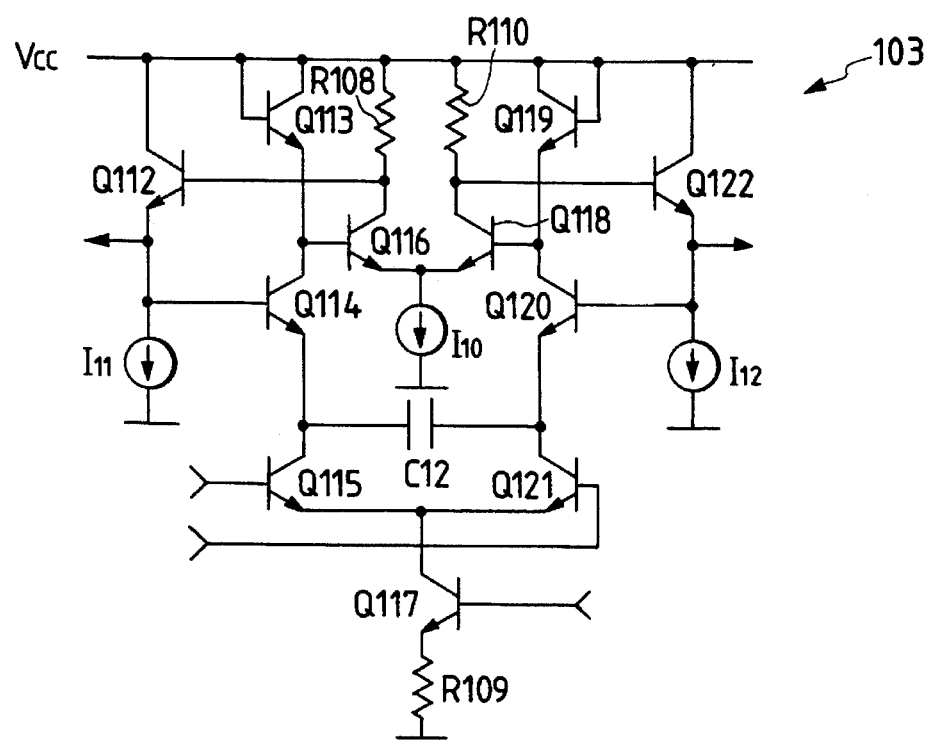
FIG. 16 shows a variable pulse delay circuit.
Figure 18A:
FIGS. 18(a) to 18(f) show timing charts explaining the operation of the circuit shown in FIG. 16.
Figure 18B:
Figure 18C:
Figure 18D:
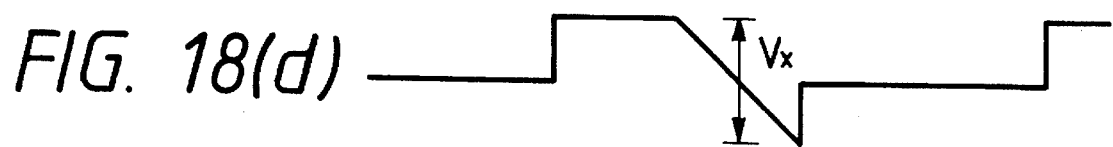
Figure 18E:
Figure 18F:

An example of the variable pulse delay circuit 103 is shown in FIG. 16, wherein Q112=Q122, Q113=Q119, Q116=Q118, Q114=Q120, Q115=Q121, and R108=R110. FIGS. 18(a)–18(f) are timing charts explaining the operation of the variable pulse delay circuit 103. FIGS. 18(a) and 18(b) show differential frequency division signals inputted to the bases of transistors Q115 and Q121. FIGS. 18(c) and 18(d) show signals outputted from the emitters of transistors Q114 and Q120. FIGS. 18(e) and 18(f) show delayed clock signals outputted from the emitters of transistors Q112 and Q122. The delay time td is proportional to C12 * Io * R108/Id. Id represents a current flowing through the transistor Q117. The delay time td can be controlled by the offset error signal.

When the duty of the clock signal inputted to the base of the transistor Q108 is large (H level duration is longer than L level duration), the offset voltage of the triangular wave signal is unstable and rises. Therefore, the output voltage of the charge pump circuit 109 rises to lower the output voltage of the offset error generator circuit 110. Then, the current Id flowing through the transistor Q117 decreases and the delay time td becomes short so that the duty of the clock signal inputted to the base of the transistor Q108 is corrected. When the duty of the clock signal inputted to the base of the transistor Q108 is small, the clock duty is corrected in the similar manner described above.

The converging value of the duty of the clock signal inputted to the base of the transistor Q108 is determined by the ratio of the charge current to the discharge current of the capacitor C11. In this case, the converging value can be regulated within plus and minus 1% by using the IC circuit technique.

The enabling circuit 105 is provided to fix the output voltage of the triangular wave signal generator unit 106 during the clock missing period to the lower peak V100 of the triangular wave signal shown in FIG. 7(a). In this case, the conditions are set to Q104= Q111, Q105>2 * Q102, and R101>2 * R103.

During the clock missing period, the transistor Q108 turns on to continue charging the capacitor C11. When the level becomes lower than V100, the discharge current is supplied from the transistor Q105 to the capacitor C11. After the charge of the capacitor C11 reaches V100, the charge is stopped until the next clock signal is inputted.

[Fifth Embodiment]

Figure 19:
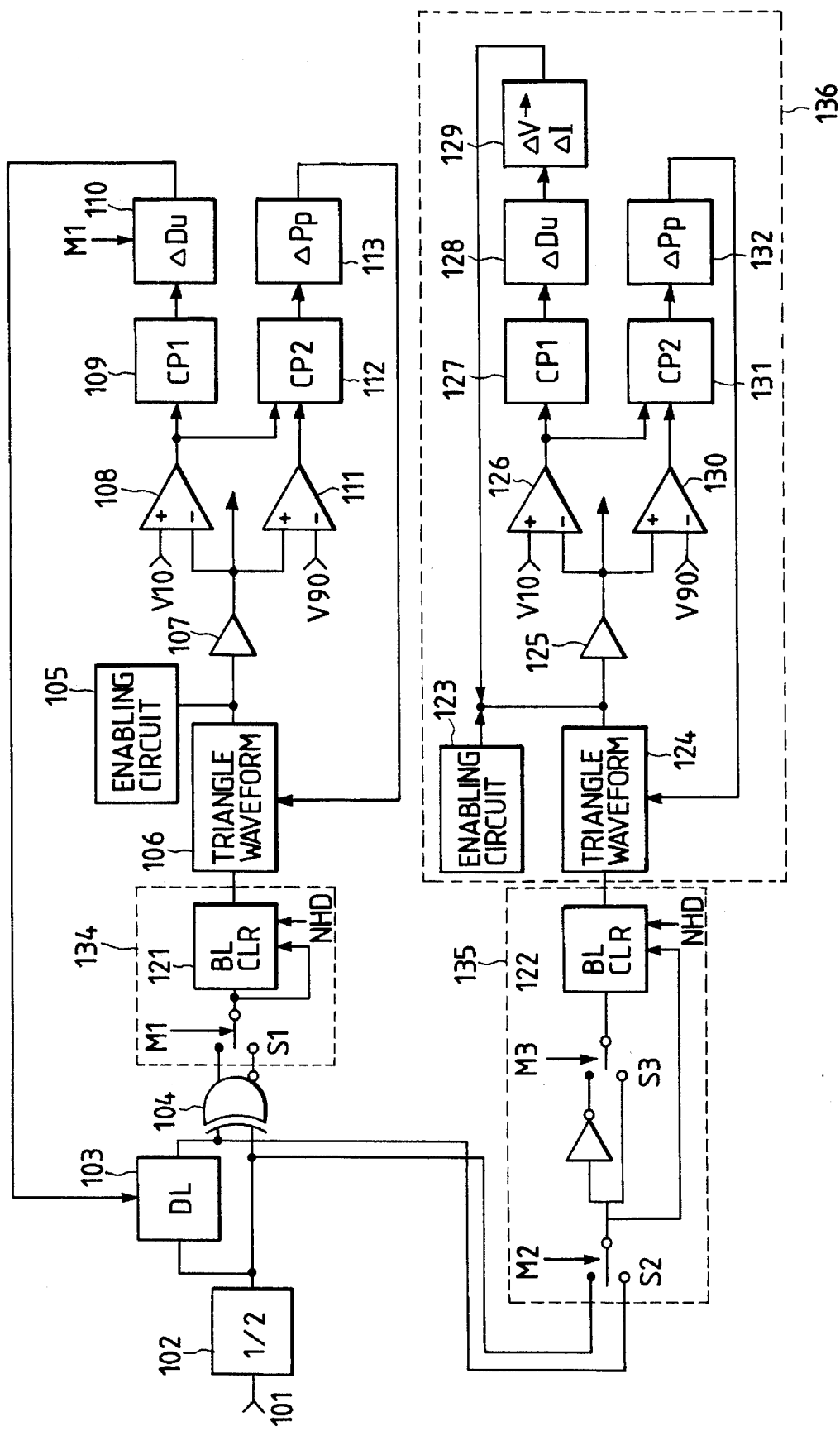
FIG. 19 shows a fifth embodiment of the triangular wave signal generator circuit.

In an LBP system with PWM pixel modulation, various modulations are performed for obtaining a high image quality, such as modulation on a single pixel unit basis, as well as modulation on a two-times pixel unit basis, and control of the pixel modulation phase on a sub-scan unit basis. FIG. 19 shows the fifth embodiment of the triangular wave signal generator circuit according to the present invention which performs such modulations. Blocks performing the same operations as FIG. 15 are represented by using identical reference numerals. The different points from FIG. 15 will be described. A single pixel modulation phase control circuit 134 changes the phase of the triangular wave signal between 0° and 180° by a mode signal M1.

Figure 20:
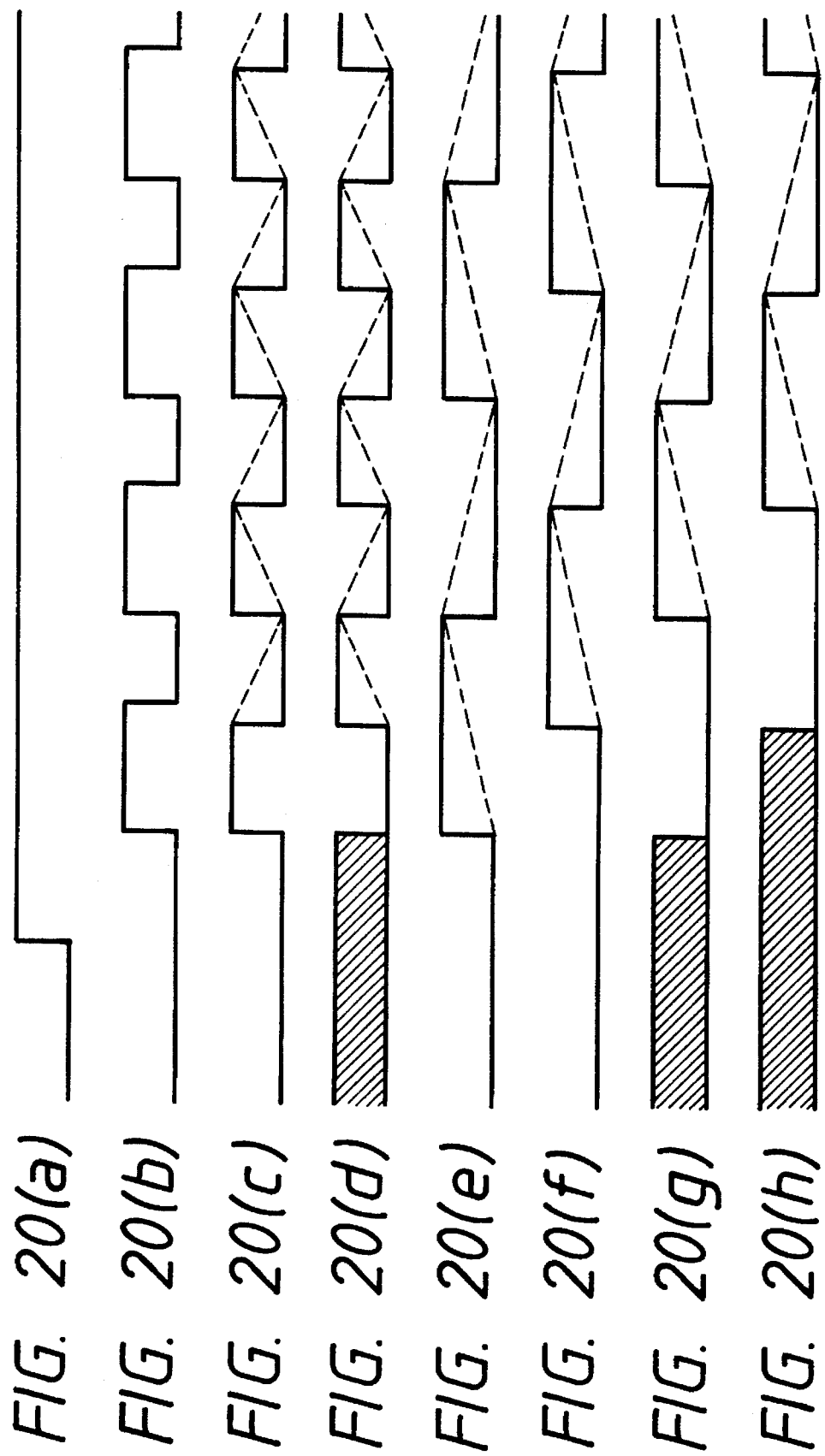
FIGS. 20(a) to 20(h) show timing charts explaining the operation of the circuit shown in FIG. 19.

FIG. 20(a) shows a horizontal synchronizing signal NHD, FIG. 20(b) shows an input clock signal, FIG. 20(c) shows an output clock signal for (M1="L") from the single pixel modulation phase control circuit 134, and FIG. 20(d) shows the output clock signal for (M="H"). The H level at the hatched portion in FIG. 20(d) is not desirable for the operation of the triangular wave signal generator unit 106, and so a blanking clear circuit 121 is used to forcibly set the H level to L level.

The mode signal M1 is used to invert the polarity of the output signal of the offset error generator circuit 110 during the "H" level of the mode signal M1. Triangular wave signals outputted from the triangular wave signal generator unit 106 are indicated by broken lines in FIGS. 20(c) and 20(d).

A two-times pixel modulation phase control circuit 135 and corresponding triangular wave signal generator circuit are also provided.

The outputs of the two-times pixel modulation phase control circuit 135 shown in FIGS. 20(e), 20(f), 20(g), and 20(h) correspond to the states (0,0), (0,1), and (1,0) and (1,1), respectively of modes signals (M2, M3). The H level at the hatched portions in FIGS. 20(g) and 20(h) is not desirable for the operation of the triangular wave signal generator unit 124, and so a blanking clear circuit 122 is used to forcibly set the H level to L level. The triangular wave signal generator circuit 136 may have basically the same structure as the triangular wave signal generator circuit for the single pixel modulation.

Since the duty of the input clock signal is made correct through the frequency division, the offset value of the triangular wave signal of this embodiment is controlled in the following manner. An output of the offset error generator circuit 128 is converted into an error current by a voltage-current converter circuit 129. The error current is added to the output of the enabling circuit 123 to ensure the balance between the charge and discharge currents of the triangular wave signal generating capacitor.

With such an arrangement, the number of control loops for the triangular wave signal generator circuit for the two-times pixel modulation can be suppressed to two, minimizing the jitter amount of phase, peak and offset values to be caused by a loop error.

[Sixth Embodiment]

Figure 21:
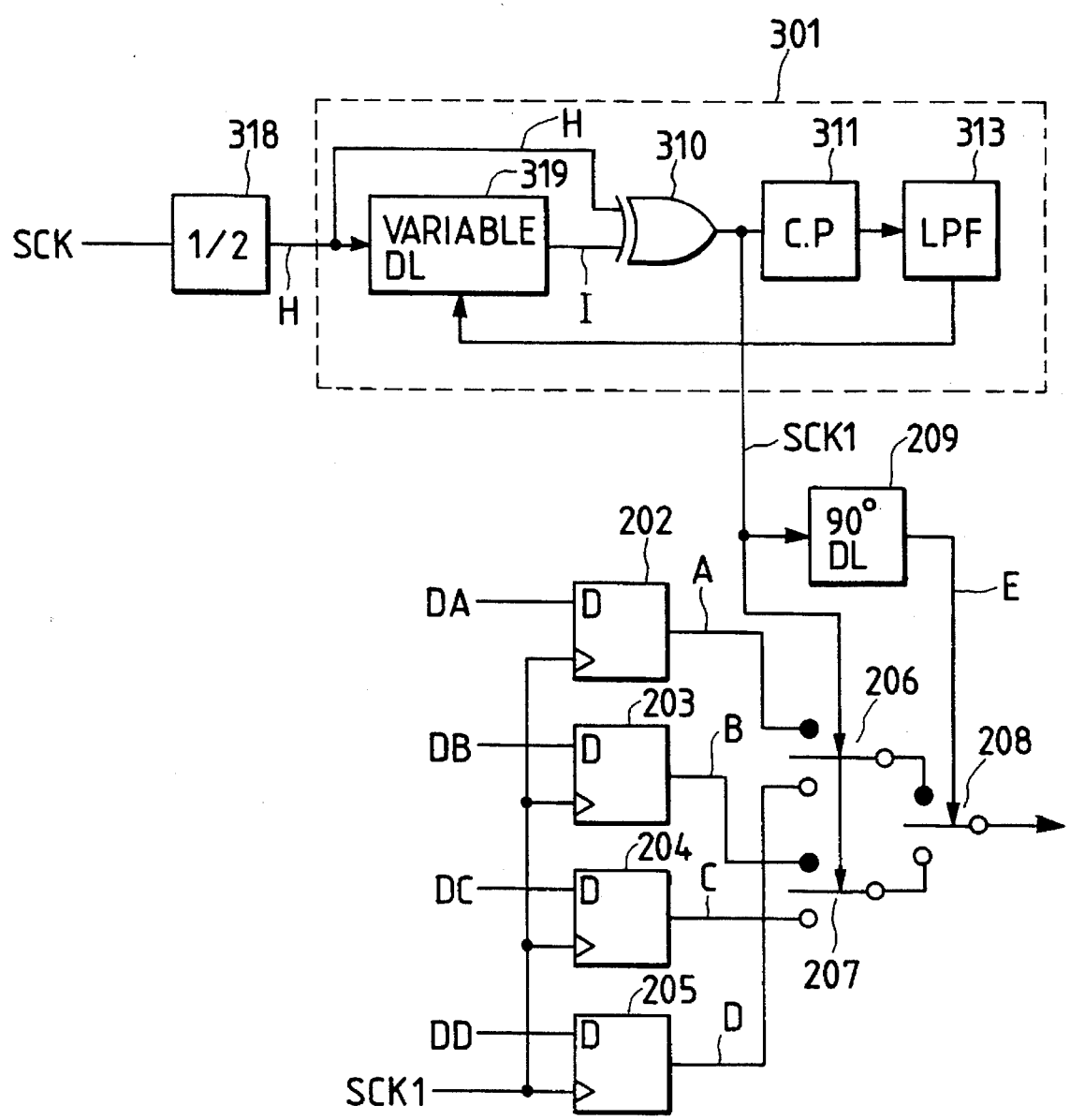
FIG. 21 is a block diagram showing a sixth embodiment of the present invention.
Figure 24:
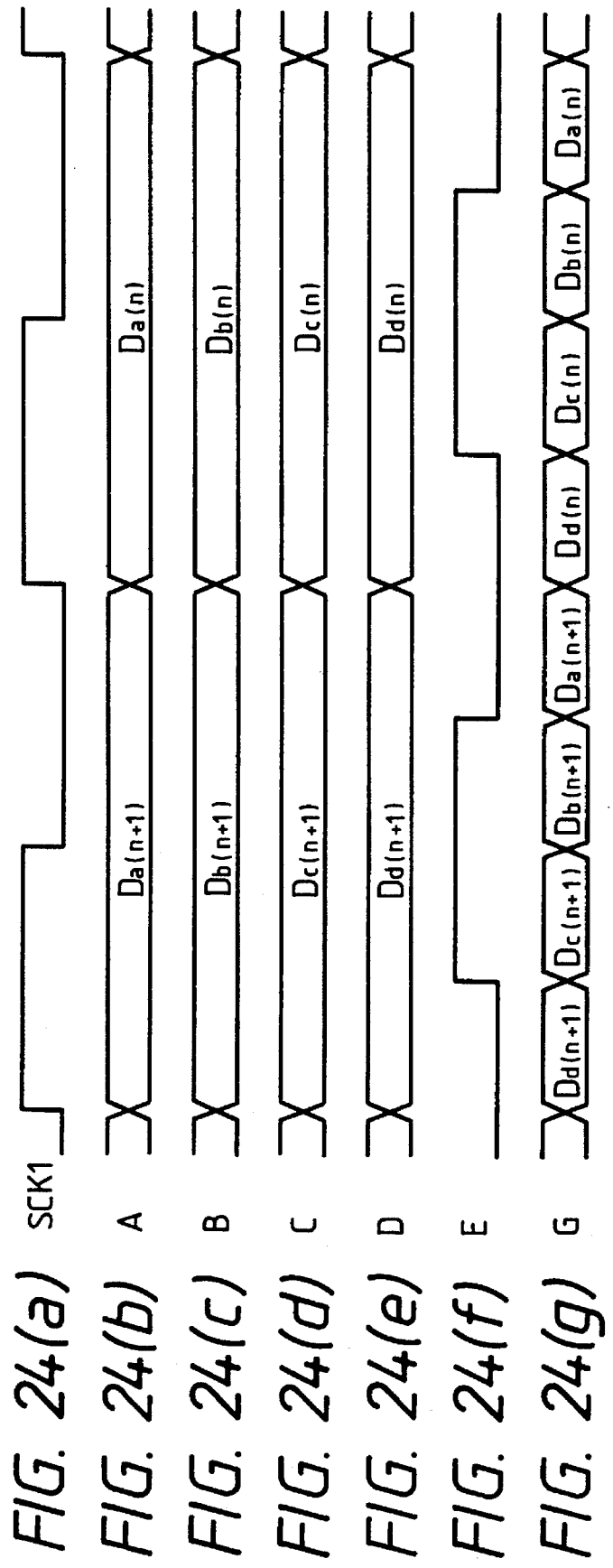
FIGS. 24(a) to 24(g) show timing charts explaining the operation of the sixth embodiment.

FIG. 21 is a circuit diagram of the sixth embodiment of the present invention, FIGS. 22(a) to 22(e) are timing charts explaining the operation of the sixth embodiment. In FIG. 21, SCK represents a pixel clock which is inputted to an input terminal of a divide-by-2 circuit 318. The duty of SCK is not always 50%. An output H of the divide-by-2 circuit 318 is a pulse signal having a duty 50% and a frequency of half that of SCK, and inputted to a 90° delay circuit 301. In this circuit 301, an exclusive OR gate 310 outputs a pulse signal having a duty 50% and a frequency two times as high as that of H. In this manner, a clock signal SCK1 having a duty 50% and the same frequency as SCK can be obtained. SCK1 is inputted to the input terminal of a delay circuit 209 and to the control terminals of switches 206 and 207. The delay amount of the delay circuit 209 is 90° relative to SCK1. This delay amount is half that of the delay circuit 319. In realizing this relation by IC circuit elements which have relatively precise values, when the capacitances of the charge/discharge capacitors C12 of the pulse delay circuit 103 shown in FIG. 16 by the delay circuits 319 and 209 shown in FIG. 21 are set to 2:1, half the delay amount of the delay circuit 319 is obtained in the delay circuit 209.

Modulated data DA, DB, DC, and DD corresponding to four subpixels obtained by dividing one pixel are inputted to data input terminals of data latches 202 to 205. An output E of the 90° delay circuit 209 is inputted to the control terminal of a switch 208. The switches 206 to 208 are connected to contacts indicated by blank circles when the signal E takes an L level, and to contacts indicated by solid circles when the signal E takes an H level. The switches 206 to 208 are controlled by signals SCK1 and E to select the modulated data.

As apparent from the timing chart shown in FIG. 22, the modulated data DA to DD inputted to the data latches 202 to 205 is selected in accordance with the signal SCK1 and signal E obtained by delaying signal SCK1 by 90°. Namely, when SCK1 takes an H level and signal E takes an L level, the switch 206 turns to the blank circle contact and the switch 208 turns to the solid circle contact to select the modulated data D.

The detailed block circuit of the 90° delay circuit 209 is shown in FIG. 23. SCK1 is inputted to a variable delay circuit 219 which delays SCK1 by the amount corresponding to the voltage at a delay amount control terminal 216. The delayed output signal of the variable delay circuit 219 is supplied to the control terminal of the switch 208 shown in FIG. 21, and to one of the input terminals of an exclusive OR gate 210, the other input terminal being supplied with SCK1. An output of the exclusive OR gate 210 is inputted to the control terminal of a switch 217 of a charge pump circuit to turn it on when the output takes an L level. In the charge pump circuit, there are provided a constant current source 214 having a current value I21 and a constant current source 215 having a current value 2 * I21. When the switch 217 turns off, a current I21 charges the capacitor C21, and when it turns on, the capacitor C21 is discharged by I21=2 * I21–I21.

An output of the charge pump is inputted via a buffer 212 to a low-pass filter LPF 213 which outputs a d.c. voltage to the delay amount control terminal of the variable delay circuit 219. The output of the exclusive OR gate 210 has the period two times that of SCK1. In accordance with this period, the charge/discharge of the charge pump circuit is controlled to increase or decrease the d.c. level of an output from LPF for the feedback control of the delay amount. The stable point of this feedback loop is obtained when the charge/discharge ratio of the charge pump circuit 211 is 1:1, i.e., when an output of the exclusive OR gate has a duty of 50%. This means that an output of the variable delay circuit 219 has delayed by 90° relative to SCK1. The variable delay circuit has the same structure as that shown in FIG. 16, the delay amount Td being given approximately by (I11 * R108 * C12)/I12.

In this embodiment, one 90° delay circuit is used to divide one pixel into four subpixels. Another delay circuit having a different delay amount may also be used. For example, one pixel may be divided into eight subpixels by using the outputs from a 45° delay circuit and a 90° delay circuit.

[Seventh Embodiment]

Figure 25:
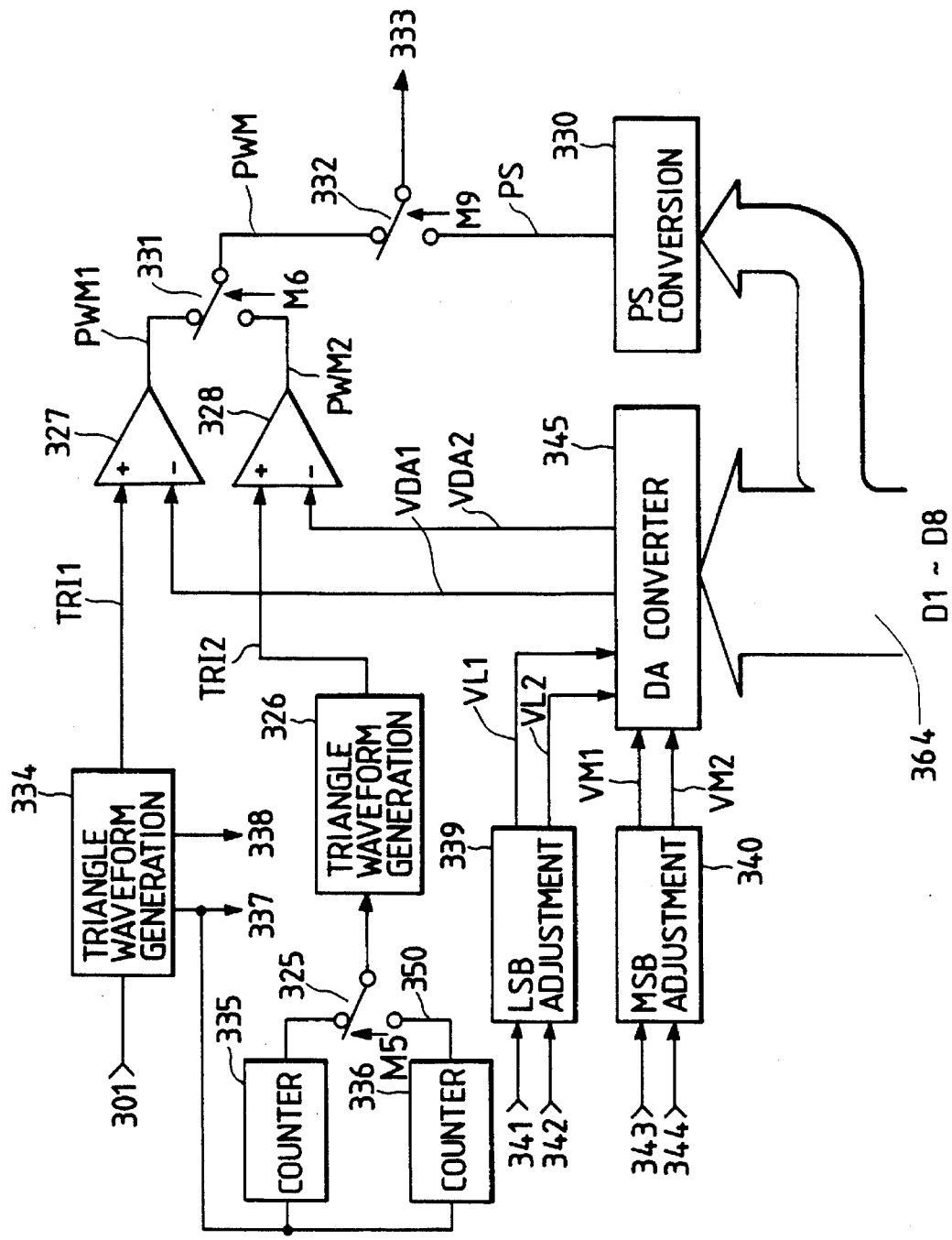
FIG. 25 shows a block diagram showing a seventh embodiment of the present invention.
Figure 26:
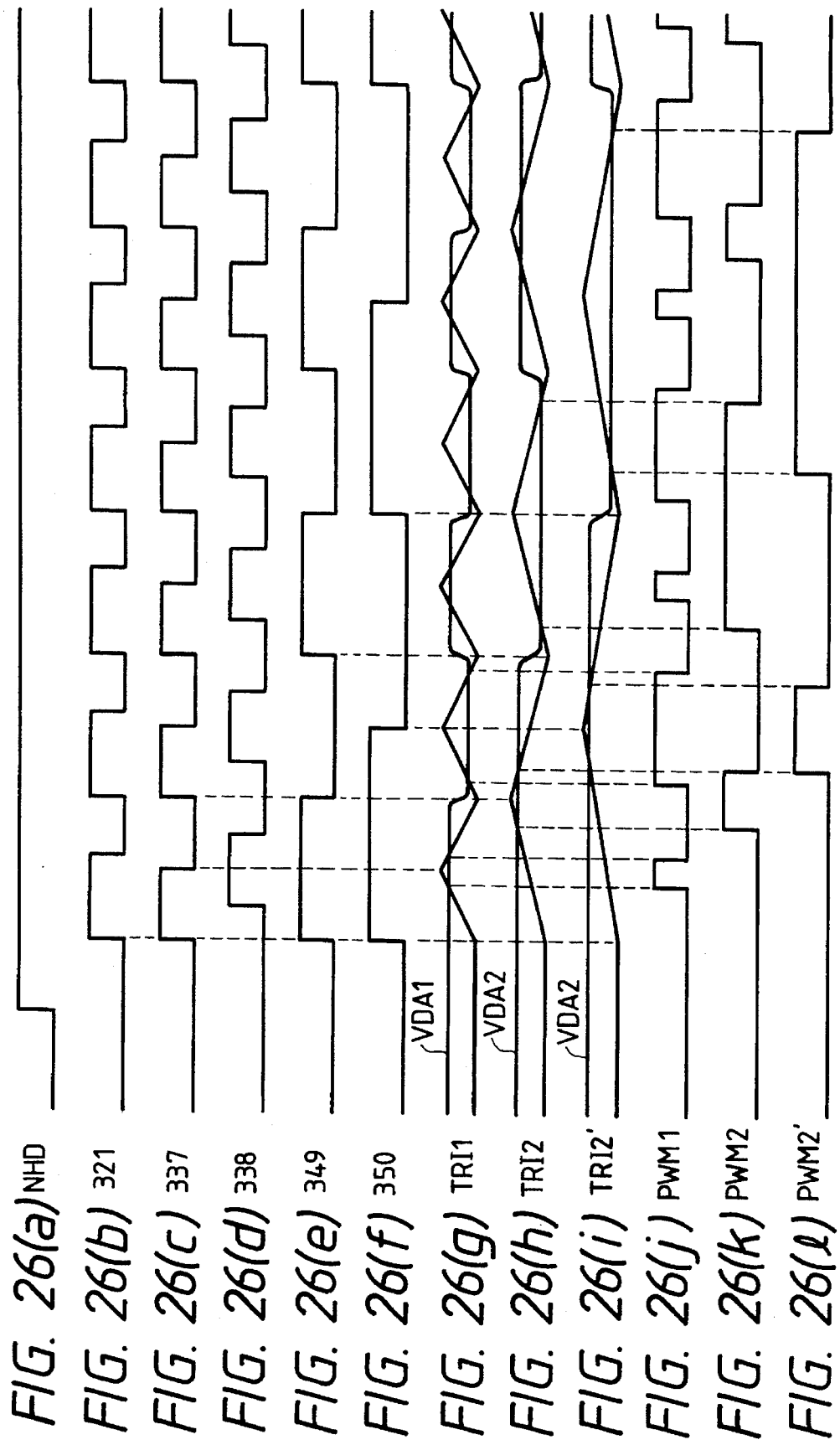
FIGS. 26(a) to 26(l) show timing charts explaining the operation of the embodiment shown in FIG. 25.

FIG. 25 is a block diagram showing the seventh embodiment of the present invention. FIG. 26 is a timing chart explaining the operation of the embodiment shown in FIG. 25. A synchronizing clock signal SCK is inputted to a terminal 301. This synchronizing clock signal such as video clocks having missing clocks at certain timings of a synchronizing signal NHD and having disturbed phases. Since the duty ratio of an inputted clock signal is indefinite, it is first necessary to reproduce the duty.

The clock signal inputted to the terminal 301 is sent to a first triangular wave generator circuit 334. This circuit 334 outputs a clock signal SK1 having a reproduced duty of 50% to a terminal 337, and a clock signal DLSK1 having a duty of 50% and a phase difference of 90° from SK1 to a terminal 338. The circuit 334 outputs a triangular wave signal having a falling slope during an L level period of SK1 and a rising slope during an H level period and having a duty of 50%. SK1 is inputted to a ½ counter 335 and to a ⅓ counter 336. The outputs of the counters are selected by a switch 325 which is controlled by a mode signal M5, and inputted to a second triangular wave generator circuit 326. The switch 325 selects the output of the ½ counter at M5=0, and the output of the ⅓ counter at M5=1. The second triangular wave signal generator circuit 326 outputs a triangular wave signal having a rising slope during an H level period of the inputted clock signal and a falling slope during an L level period and having a duty of 50%. The outputs TRI1 and TRI2 of the first and second triangular wave generator circuits 334 and 326 have a duty of 50% and the rating levels and offsets.

TRI1 is inputted to the non-inverting terminal of a comparator 327, and TRI2 is inputted to the non-inverting terminal of a comparator 328. Connected to the inverting terminals of the comparators 327 and 328 are first and second outputs VDA1 and VDA2 of a D/A converter 345 (hereinafter abbreviated as DAC).

The LSB level of VDA1 of DAC 345 is determined by a first output VL1 of an LSB adjusting circuit 339 which output is controlled by a signal applied to the adjusting terminal 341 of the circuit 339, whereas the LSB level of VDA2 is determined by a second output VL2 of the LSB adjusting circuit 339 which output is controlled by a signal applied to the adjusting terminal 342 of the circuit 339. The first and second outputs VL1 and VL2 are correlated to the d.c. offsets and levels of the triangular wave signals TRI1 and TRI2, so that even there is an environmental change such as power supply and temperature drifts, the relation between the LSB levels of DAC 345 and the triangular wave signals will not change. The MSB level of VDA1 of DAC 345 is determined by a first output VM1 of an MSB adjusting circuit 340 which output is controlled by a signal applied to the adjusting terminal 343 of the circuit 340, whereas the MSB level of VDA2 is determined by a second output VM2 of the MSB adjusting circuit 340 which output is controlled by a signal applied to the adjusting terminal 344 of the circuit 340. Similar to VL1 and VL2, the first and second outputs VM1 and VM2 are correlated to the d.c. offsets and levels of the triangular wave signals TRI1 and TRI2, so that even there is an environmental change such as power supply and temperature drifts, the relation between the MSB levels of DAC 345 and the triangular wave signals will not change. DAC 345 outputs the levels corresponding to the pixel data, for example, of eight bits (D1 to D8) to the inverting input terminals of the comparators 327 and 328.

The comparators 327 and 328 output PWM signals PWM1 and PWM2 which have the peaks of the triangular wave signal as centers of the signals and corresponding to the adjusting state of DAC 345 and the pixel data values. PWM1 and PWM2 are applied to the input terminals of a switch 331 which is controlled by a mode signal M6. PWM1 is selected at M6=0, and PWM2 is selected at M6=1.

An output PWM from the switch 331 is applied to one input terminal of a switch 332, an output PS of parallel-serial converter circuit 330 (hereinafter called a PS converter circuit) is applied to the other input terminal of the switch 332.

The lower four bits (D1 to D4), for example, of the pixel data is parallel inputted to the PS converter circuit 330, the above-described signals SK1 and DLSK1 being inputted as clock signals. The switch 332 is controlled by a mode signal M9. PWM is selected at M9=0, and PS is selected at M9=1.

The first triangular wave generator circuit 334 is the same as that of the fourth embodiment (FIG. 15), and so the description thereof is omitted.

The second triangular wave generator circuit 326 is the same as that of the fifth embodiment (FIG. 19), and so the description thereof is omitted.

Figure 27:
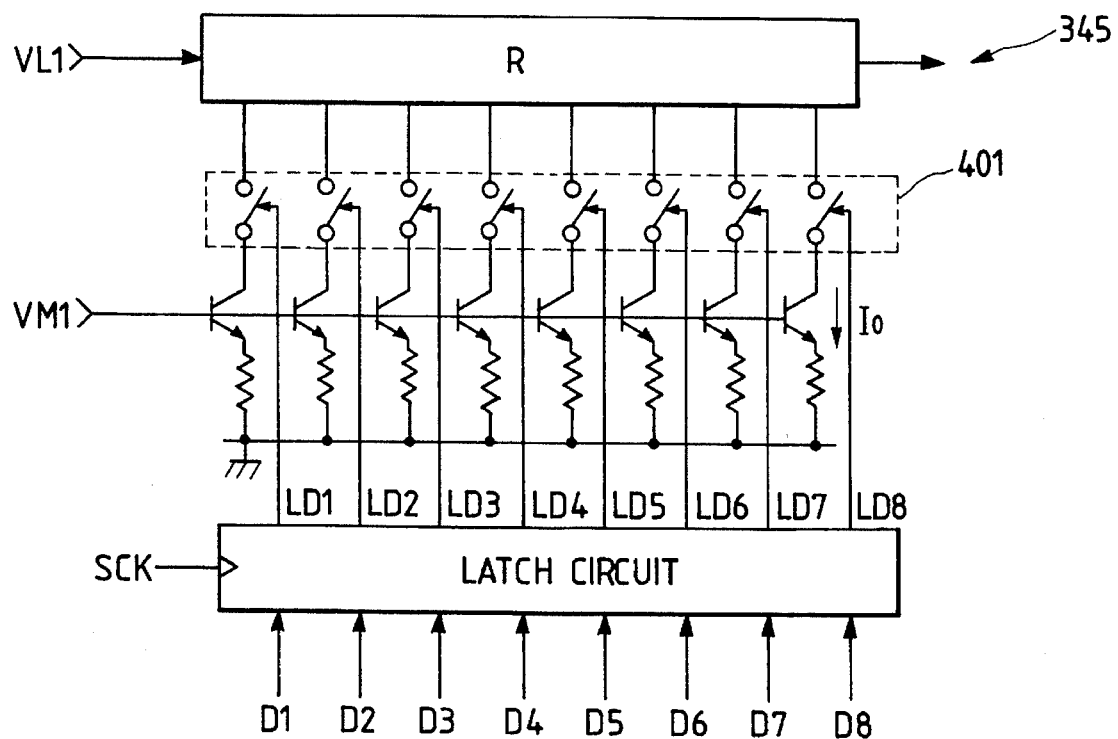
FIG. 27 shows a diagram showing an example of the structure of the D/A converter 345 shown in FIG. 25.

FIG. 27 shows an example of DAC 345. In FIG. 27, the circuit system only for the first output VDA1 is shown. The circuit system for the second output VDA2 has the same structure as the first output VDA1. In FIG. 27, VL1 is an output of the LSB adjusting circuit 339, and VM1 is an output of the MSB adjusting circuit 340. The pixel data D1 to D8 are latched by the latch circuit at the rising edge of the clock signal SCK. Each latch output LDn is applied to the control terminal of a switch 401 to turn on it when LDn takes an H level. The current Io flowing through the switch 401 is determined by VM1. According to the circuit design, the output VDA1 of DAC 345 is given by:

VDA1=VL1 when D1 to D8=0, and

VDA1=VL1−R * Io when D1 to D8=1

The LSB and MSB adjusting circuits 339 and 340 will be described. The LSB and MSB adjusting circuits 339 and 340 adjust DAC 345 so that DAC 345 outputs the voltage values from V0 to V100 shown in FIG. 7(*a*). In this case V(LSB)>V(MSB). V0 is the upper peak level of the triangular wave signal, and V100 is the lower peak level. As described previously, the level and d.c. offset of a triangular wave signal are controlled by reference voltages V10 and V90. An output of DAC 345 is given by a function of V10 or V90, or both. In this manner, a change in the level and offset of the triangular wave signal can be regulated.

Figure 28:
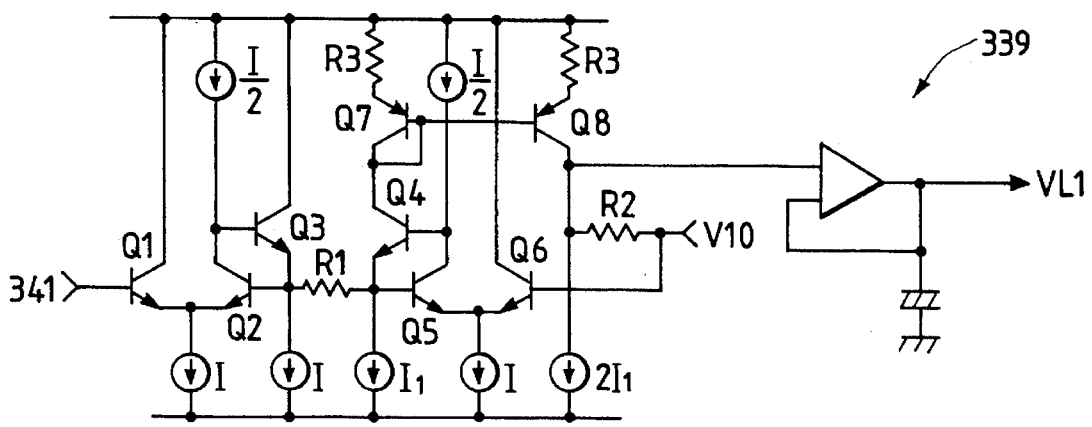
FIG. 28 shows a circuit diagram showing an example of the LSB adjusting circuit 339 shown in FIG. 25.

An example of the LSB adjusting circuit 339 is shown in FIG. 28. Inputted to the terminal 341 is a voltage Val (=n * V10+(1−n) * V90) related to V10 and V90, where 0≦n≦1. The voltage V (Q8/C) at the collector of the transistor Q8 is given by:

$$V(Q8/C)=V10+R2\ ((1-n)\ *\ (V10-V90)/R1)-I1)$$

By defining (I1 * R2) by the same function of V10 and V90, it is possible to stably adjust V(Q8/C) independently from the power source Vcc and temperature. For example, if the adjustment range of LSB level is designed to be from V0 to V30, the following conditions are set:

$$R2 * I1 = V10 - V30 = \Delta V30$$

$$(V10-V90) * R2/R1 = V0 - V30 = \Delta V30$$

where $\Delta V20$ is a level corresponding to 20% of the peak-to-peak of the triangular wave signal. It is therefore possible to adjust the LSB level in accordance with the voltage (V10 to V90) at the terminal 341, i.e., V30 when the voltage at the terminal 341 is V10 and V0 when the voltage at the terminal 341 is V90.

Figure 29:
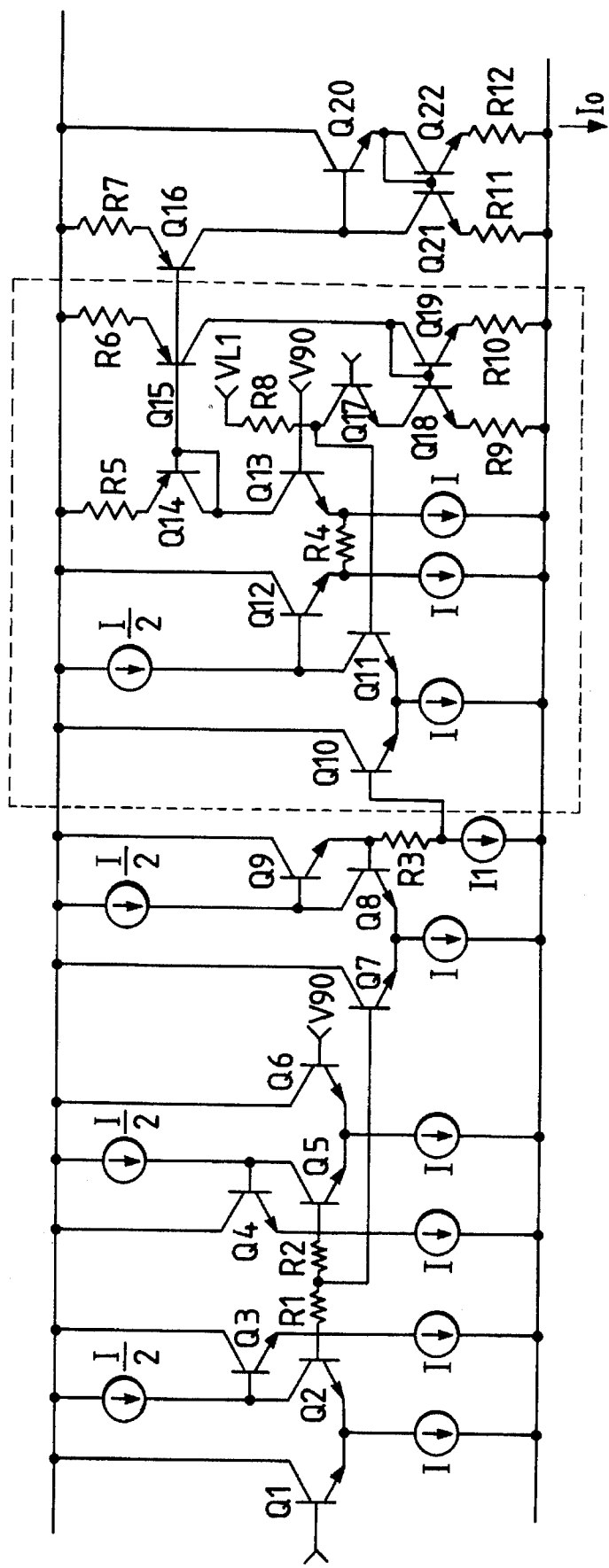
FIG. 29 shows a circuit diagram showing an example of the MSB adjusting circuit 340 shown in FIG. 25.

An example of the MSB adjusting circuit 340 is shown in FIG. 29. Inputted to the terminal 343 is a voltage Vam (=m * V10 +(1-m) * V90) having the same voltage range as Val at the LSB adjusting terminal, where $0 \leq m \leq 1$. The voltage V (Q7/B) at the base of the transistor Q7 is given by:

$$V(Q7/B) = V90 + m (V10-V90) * R2/(R1+R2)$$

The voltage V(Q10/B) at the base of the transistor Q10 is given by:

$$V(Q10/B) = V(Q7/B) - R3 * I1$$

By defining (R3 * I1) by the same function of V10 and V90, it is possible to stably adjust V(Q10/B) relative to the bias of the triangular wave, independently from the power source Vcc and temperature. The circuit portion enclosed by a broken line is a feedback amplifier to maintain the potential of Q11/B same as that of Q10/B. A voltage (R8 * I2) lowered from VL1 by an output current I2 times R8 is applied as Q11/B. By setting R8 and I2 to R and Io, respectively, in FIG. 28, the voltage Q11/B becomes the MSB level of DAC 345. As a result, in this feedback amplifier, a current flows out of the collector of Q16 so as to set the MSB level of DAC 345 to the potential Q10/B. This current is used for biasing DAC 345 and outputting VM1 from DAC 345.

For example, if the adjustment range of MSB level is designed to be from V70 to V100, the voltage change at Q7/B, {(V10–V90) * R2/(R1+R2)}, is designed to be V30 (=V70–V100).

$$R2/(R1+R2) = V30/V(10/90) = \frac{3}{8}$$

Since Q7/B=V90 at m=0, the level shift amount by R3 is:

$$R3 * I1 = V100 - V90 = \Delta V10$$

where $\Delta V10$ is a level corresponding to 10% of the peak-to-peak of the triangular wave signal. It is therefore possible to adjust the MSB level in accordance with the voltage (V10 to V90) at the terminal 343, i.e., V70 when the voltage at the terminal 343 is V10 and V100 when the voltage at the terminal 343 is V90.

The PS converter circuit 330 may have the structure (reference numbers 202 to 209) of the sixth embodiment (FIG. 21). The PS converter circuit 330 and switch 332 may be omitted to directly output the PWM signal.

[Eighth Embodiment]

In an LBP system with PWM pixel modulation, various modulations are performed for obtaining a high image quality, such as modulation on a single pixel unit basis, as well as modulation on a two-times or three-times pixel unit basis, and control of the pixel modulation phase on a sub-scan unit basis.

Figure 30:
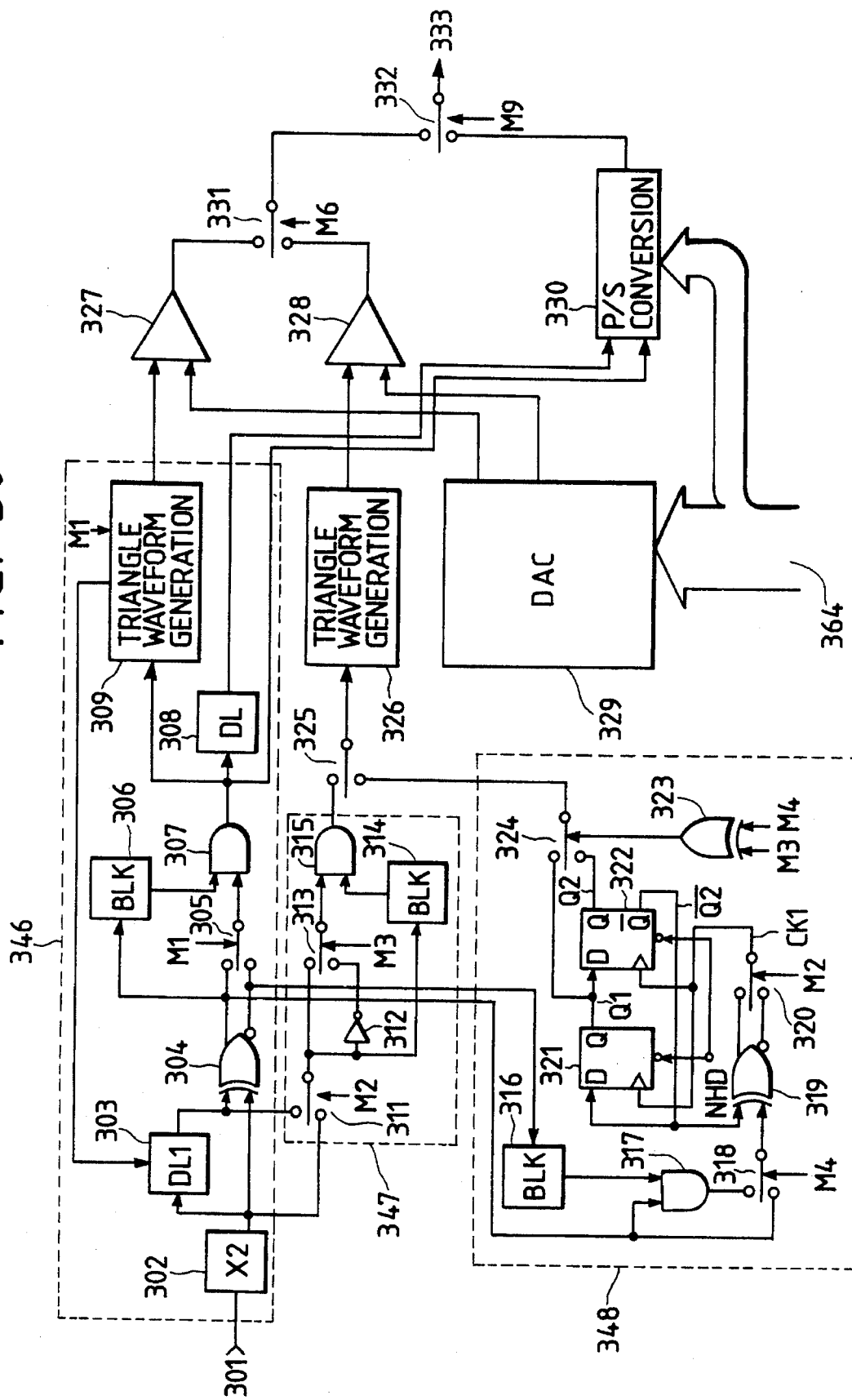
FIG. 30 shows a block diagram showing an eighth embodiment of the present invention.

FIG. 30 shows the eighth embodiment of the triangular wave signal generator circuit according to the present invention which performs such modulations. Blocks performing the same operations as FIG. 25 are represented by using identical reference numerals.

The different points from FIG. 25 will be described. The first triangular wave signal generator circuit is provided with a switch 305 for changing the phase of the triangular wave signal between 0° and 180° by the mode signal M1.

FIG. 31(a) shows a horizontal synchronizing signal NHD, FIG. 31(b) shows an input clock signal, FIG. 31(c) shows an output clock signal for (M1="L") from the switch 305, and FIG. 31(d) shows the output clock signal for (M="H"). The H level at the hatched portion in FIG. 31(d) is not desirable for the operation of the triangular wave signal generator unit 309, and so a blanking clear circuit 307 is used to forcibly set the H level to L level.

The mode signal M1 is used to invert the polarity of the output signal of the offset error generator circuit 10 such as shown in FIG. 10 during the "H" level of the mode signal M1. Triangular wave signals outputted from the triangular wave signal generator unit 309 are indicated by broken lines in FIGS. 31(c) and 31(d).

The phase of the clock signal inputted to the second triangular wave generator circuit 326 can be changed by two-times and three-times pixel modulation phase control circuits 347 and 348.

The outputs of the two-times pixel modulation phase control circuit 347 shown in FIGS. 31(e), 31(f), 31(g), and 31(h) correspond to the states (0,0), (0,1), and (1,0) and (1,1), respectively of mode signals (M2, M3). The H level at the hatched portions in FIGS. 31(g) and 31(h) is not desirable for the operation of the triangular wave signal generator unit 326, and so a blanking clear circuit 314 and a gate circuit 315 are used to forcibly set the H level to L level.

Figures 32A, 32B, 32C, 32D, 32E, 32F, 32G, 32H, 32I, 32J, 32K, 32L:
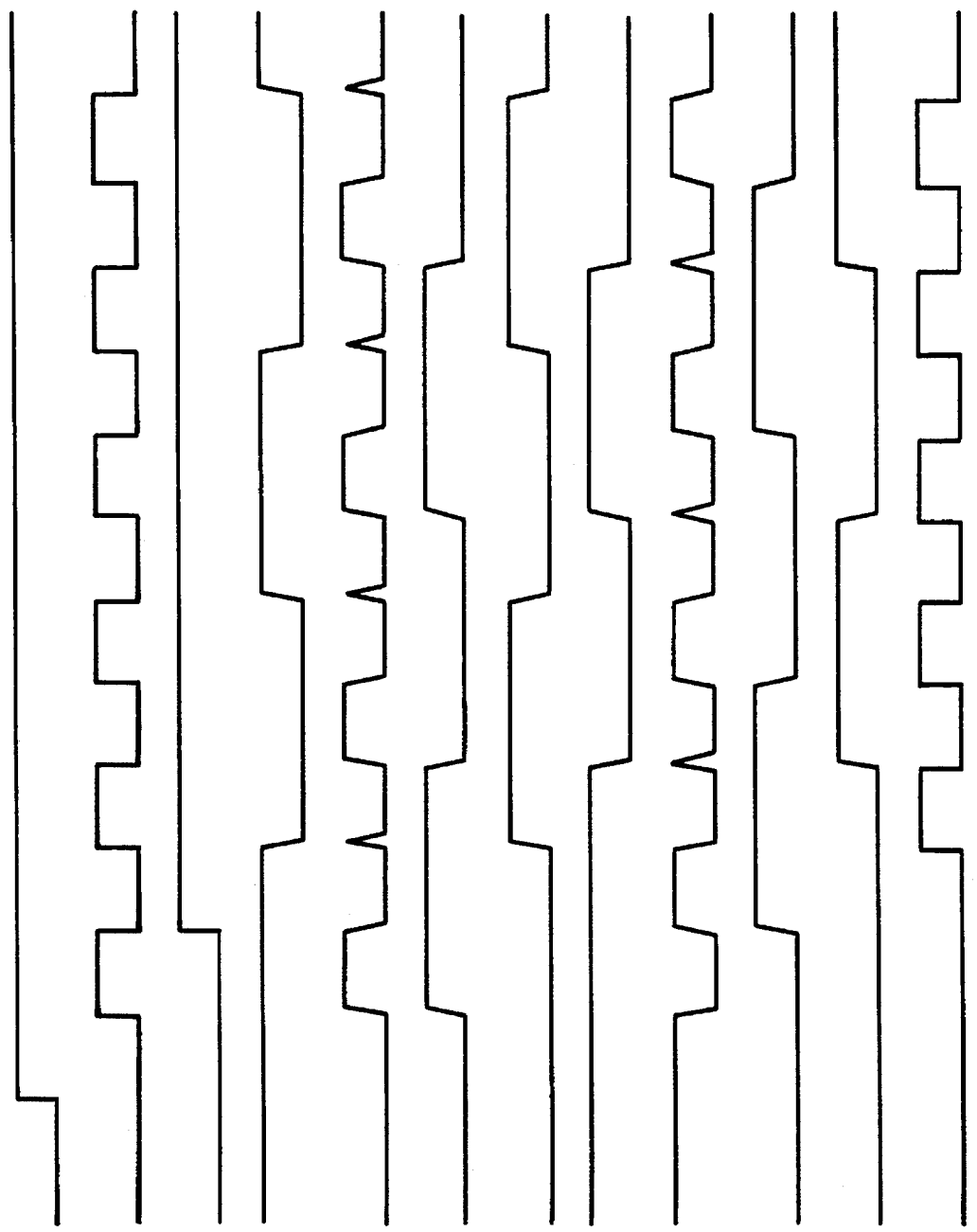
FIGS. 32(a) to 32(l) show timing charts explaining the operation of the three-times pixel modulation phase control circuit 348 shown in FIG. 30.

FIGS. 32(a) and 32(b) are timing charts explaining the operation of the three-times modulation phase control circuit 348. Particularly, FIG. 32(a) shows a horizontal synchronizing signal NHD, and FIG. 32(b) shows an input clock signal SK1 having a reproduced duty. SK1 is selected when a control signal M4 of L level is supplied to a switch 318, and applied to one input terminal of a coincidence circuit 319. The polarity of an output from the coincidence circuit 319 is changed by the mode signal M2. A coincident signal is outputted via the switch 320 at the L level of M2, and a disagree signal is outputted at the H level of M2. An output is applied via the switch 320 to clock terminals of first and second DFFs 321 and 322. The outputs of the first and second DFFs are cleared by the horizontal synchronizing signal NHD, and are forced to take the L level during the L period of NHD. An inverted output NQ2 of the second DFF 322 is supplied to the other input terminal of the coincidence circuit 319 and to the data input terminal of the first DFF. The output Q1 of the first DFF 321 is supplied to the data input terminal of the second DFF 322. When the clock signal shown in FIG. 32(b) is inputted to one input terminal of the coincidence circuit 319 and the inverted output NQ2 (FIG. 32(d), initial value=HI) of the second DFF cleared by NHD is inputted to the other terminal, an output of the coincidence circuit 319 rises from LO to HI. Using this output as the clock, the first and second DFF 321 and DFF 322 control their output data (FIGS. 32(f) and 32(g)). Next, when the signal shown in FIG. 32(e) rises, DFF 321 and DFF 322 change as shown in FIGS. 32(f) and 32(g). At this time, the rising edge of an output of the coincidence circuit (FIG. 32(e)) changed by the clock signals shown in FIGS. 32(b) and 32(d) changes an output of DFF 322 to make the output of the coincidence circuit to have the L level. Repeating the above operation, signals shown in FIGS. 31(d), 31(e), 31(f), and 31(g) are outputted from the respective blocks. The output of DFF 321 shown in FIG. 32(f) has a period of three times as high as that of the input clock shown in FIG. 32(b) inputted to the three-times pixel modulation phase control circuit, with no phase difference therebetween. The output of DFF 322 shown in FIG. 32(g) has a phase delay of 321.

At the state of M4=L and M2=H, the inverted output of DFF 321 is as shown in FIG. 32(h), an output of the switch 320 is as shown in FIG. 32(i), the non-inverted output of DFF 321 is as shown in FIG. 32(j), and the output of DFF 322 is as shown in FIG. 32(k). The signals shown in FIGS. 32(j) and 32(k) are delayed by 60° and 180° from the signal shown in FIG. 32(f).

At the states of M4=H, the switch 318 selects an output from the gate 317 so that the clock signal (FIG. 32(l)) masked by the blanking pulse shown in FIG. 32(c) is applied to the input terminal of the coincidence circuit 319. The operation associated with the output of the coincidence circuit is the same as that described above. Therefore, the outputs of DFF 321 and DFF 322 are such that the signals shown in FIGS. 32(d) to 32(g) are delayed by one period of the signal shown in FIG. 32(b), in accordance with the level of the mode signal M2. Namely, the output of DFF 322 is delayed by 240° at M2=L and by 300° at M2=H from the phase of the signal shown in FIG. 32(f).

The outputs of DFF 321 and DFF 322 are applied to input terminals of a switch 324. Connected to the control terminal of the switch 324 is an output of a coincidence circuit 323 which is inputted with the mode signals M3 and M4. The switch 324 selects an output of DFF 322 when the output of the coincidence circuit 323 takes the L level, and selects an output of DFF 321 when it takes the H level.

The outputs of the three-times pixel modulation phase control circuit 348 are shown in FIGS. 31(i), 31(j), 31(k), 31(l), 31(m), and 31(n) corresponding to the states (0,0,0), (0,0,1), and (0,1,0), (0,1,1), (1,0,0), and (1,0,1), respectively of mode signals (M4, M3, M2).

FIGS. 33(a) to 33(c) show the phases of the single, two-times, and three-times pixel modulation clocks (corresponding to the outputs from switch 305, gate 315, and switch 324).

A pixel modulation signal can be outputted from the output terminal in the manner similar to the seventh embodiment. DAC 329 shown in FIG. 30 includes DAC 345, LSB adjusting circuit 339 and MSB adjusting circuit 340, and the triangular wave signal generator circuit 369 corresponds to the circuit elements 105 to 113 shown in FIG. 15 excepting the duty reproducing circuit.

[Ninth Embodiment]

Figure 34:
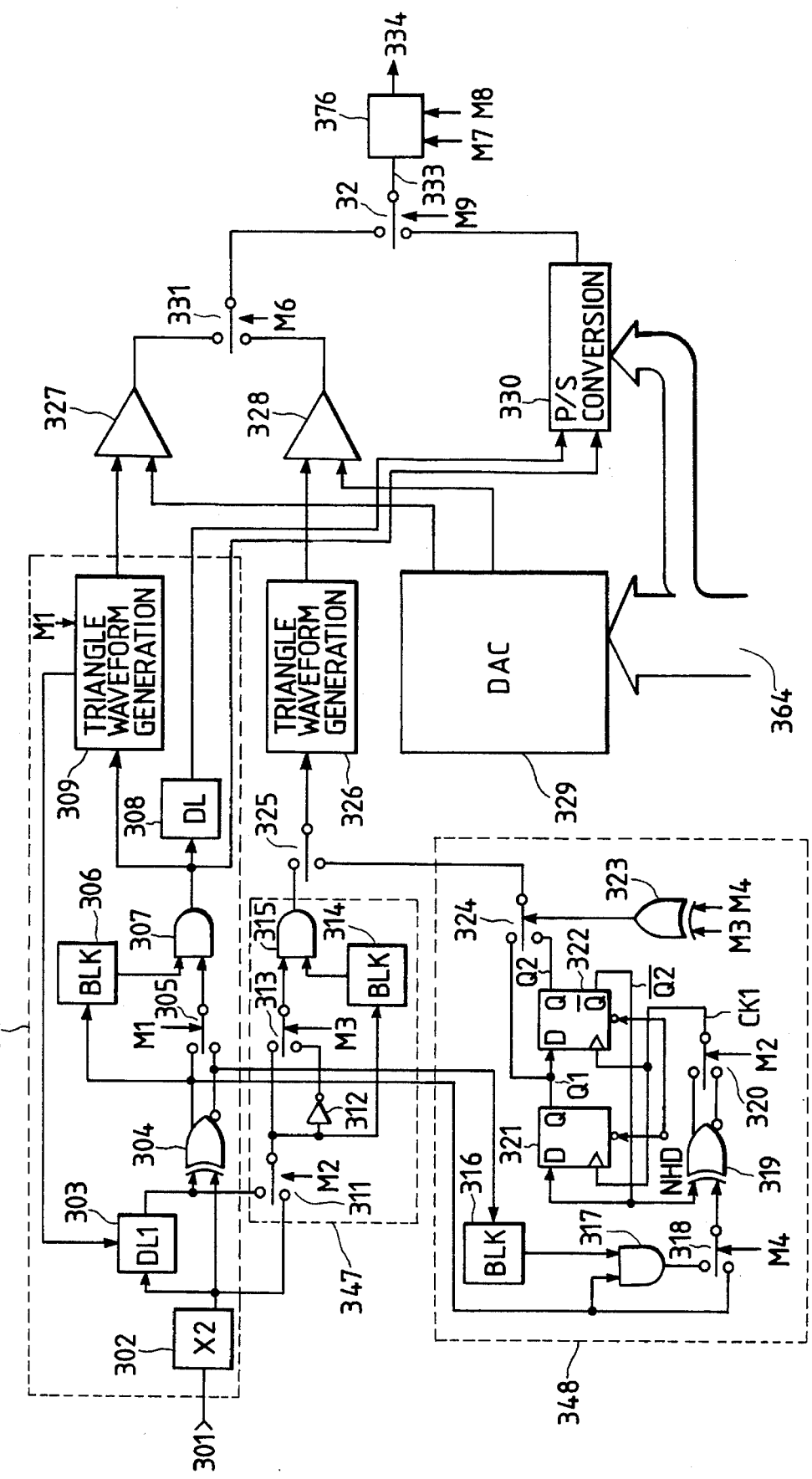
FIG. 34 shows a block diagram showing a ninth embodiment of the present invention.
Figures 35A, 35B:
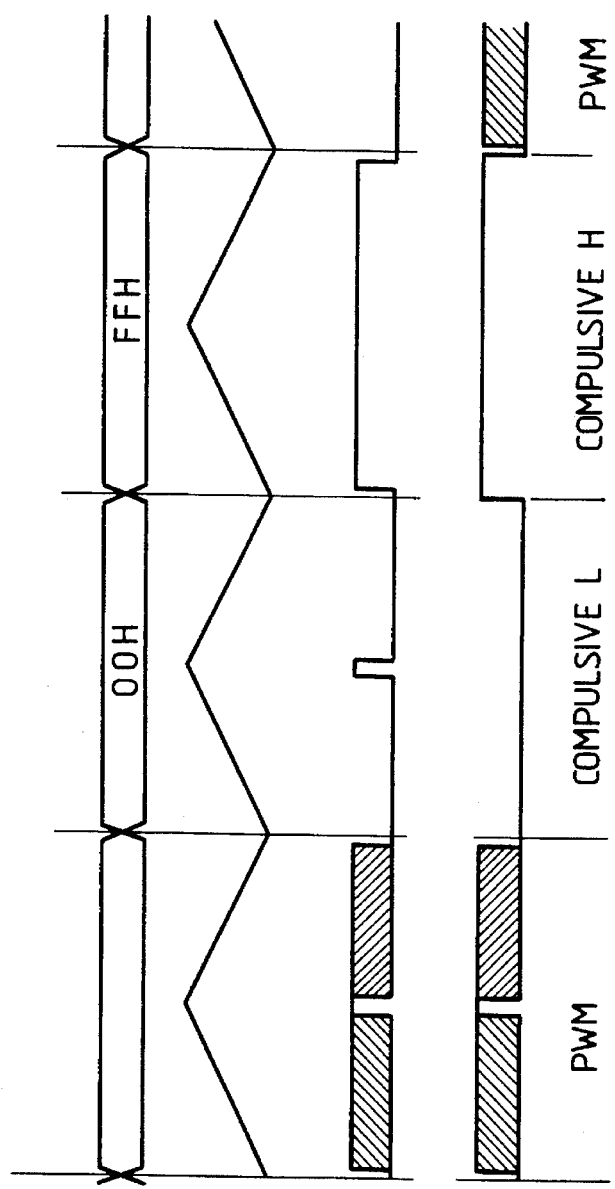

The ninth embodiment of the present invention is illustrated in FIG. 34. In FIG. 34, blocks performing the same operations as described with FIG. 30 are represented by using identical reference numerals. In this embodiment, the output terminal 333 shown in FIG. 30 is connected to a compulsive HL control circuit 376 whose output state is controlled by mode signals M7 and M8. The pixel modulation signal at the terminal 333 is compulsively set to the H or L level irrespective of the pixel data D1 to D9 by the mode signals M7 (compulsive L) and M8 (compulsive H). The printing density of 0 or 100% can be ensured reliably without using the corresponding pixel modulation signal having a pulse width of a minimum or maximum value. FIGS. 35(A) to 35(D) is a timing chart explaining the operation of this embodiment shown in FIG. 34. FIG. 35(A) shows pixel data, FIG. 35(B) shows a triangular wave signal with a single pixel modulation phase control, and FIG. 35(C) shows a pixel modulation output only with the PWM mode. In FIG. 35(C), a pixel modulation signal having a minimum pulse width is outputted for the pixel data 00H corresponding to the printing density of 0%, and a signal having a maximum pulse width is outputted for the pixel data FFH corresponding to the printing density of 100%. This settings of the minimum and maximum pulse widths provide an effective modulation for the printing densities of 0 and 100%. It is however difficult to ensure the absolute printing densities of 0 and 100% because various factors such as a laser driver, photosensitive material and the like may change even if the pulse width is correct. For this reason, the compulsive HL mode along with the PWM mode is used as shown in FIG. 35(D), to reliably ensure the absolute printing densities of 0 and 100%.

[Tenth Embodiment]

A pixel modulation apparatus as the tenth embodiment will be described wherein the modulation phase can be set variably on the basis of one fourth of the input clock period T.

Figure 36:
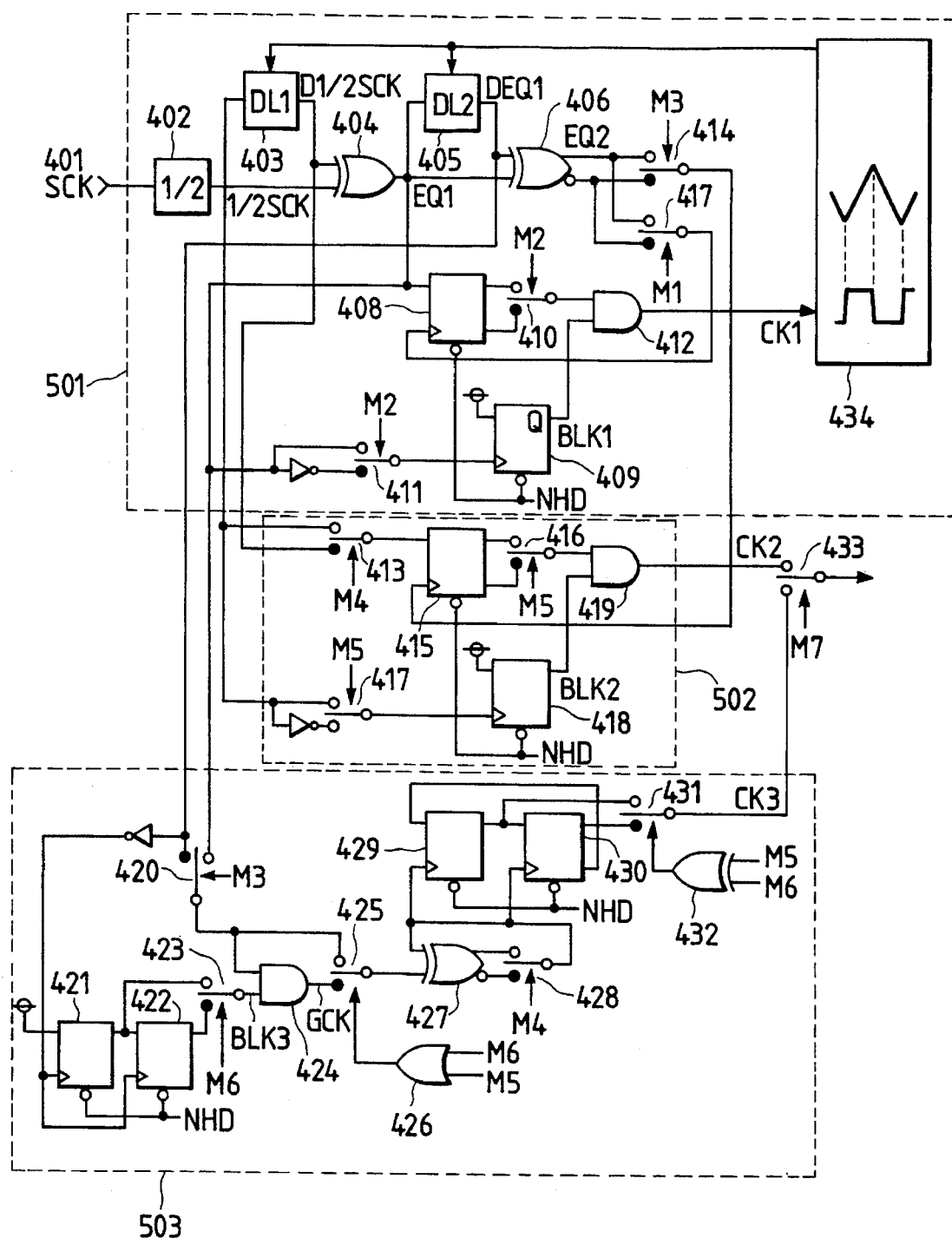
FIG. 36 shows a block diagram showing a tenth embodiment of the present invention.

FIG. 36 is a block diagram showing the tenth embodiment of the present invention. FIGS. 37 and 38 are timing charts explaining the operation of the embodiment shown in FIG. 36. In FIG. 36, a synchronizing clock signal SCK is inputted to a terminal 401. This synchronizing clock signal such as video clocks having missing clocks at certain timings of the synchronizing signal NHD and having disturbed phases. The duty ratio of an inputted clock signal is indefinite.

First and second variable delay circuits 403 and 405 control to make the duty of a clock signal CK1 inputted to the triangular wave signal generator unit become 50%.

SCK inputted to the terminal 401 is converted by a divide-by-2 circuit 402 into a clock signal ½-SCK having half the frequency of SCK and a duty of 50%. Inputted to EXOR 404 are ½-SCK and D-½-SCK delayed by T1 by the first delay circuit 403 controlled by the triangular wave generator unit in the manner described previously. EXOR 404 outputs an exclusive OR logical sum output EQ1.

The second variable delay circuit 405 is designed to provide a delay amount (T1/2) which is half that of the first delay circuit 403. The relative design error between the two delay amounts can be made an extremely small value within the IC components variation range.

With the second variable delay circuit 405 and EXOR 406, EQ2 is outputted from EXOR 406 in the same manner as EQ1. An output of EXOR 406 is supplied to the clock input terminal of FF 408, while the polarity of the output is controlled by a switch 407. An output of FF 408 is gated by a blanking signal BLK1 generated by FF 409 and supplied as CK1 to the triangular wave signal generator unit.

As described above, CK1 is controlled to have a duty of 50% by the triangular wave signal generator unit and variable delay circuit 403. Therefore, the frequency of EQ2 used as the clock of FF 408 which outputs CK1 is stable. This stability implies the duty 50% of EQ1, and hence the duty approximately 50% of EQ2. The feedback loop controls the delay amount of DL1 to have a duty 50% of CK1, and does not directly control the delay amount of DL2 considering the relative design error between the delay amounts of DL1 and DL2. However, if the circuits are made of ideal components, EQ2 has also a duty 50%. As described above, since the IC component performance variation is extremely small, the practical duty shift of DL2 of EQ2 is very small. For the simplicity of the description, the duty of EQ2 is assumed to be 50% in the following.

CK1a is a portion of EQ1 latched by FF 408 by the timing period of EQ2. The polarity of EQ2 is inverted by the mode signal M1 at a switch 410 to obtain CK1b having the inverted polarity of CK1a. CK1c and CK1d are inverted signals of CK1a and CK1b. Since the level at the hatched portions shown in FIGS. 37(j) and 37(k) is required to be set to the L level, CK1c and CK1d are outputted after being gated by an output BLK1 of FF 409 whose input clock signal is switched by the mode signal M2 at a switch 411.

The phase shift amount of CK1a to CK1d is half the period of EQ2, and quarter the period of the shortest pixel clock SCK. CK1a to CK1d shown in FIGS. 37(h) to 37(k) are controlled by the mode signals M1 and M2. In FIG. 36, each switch selects the contact indicated by a blank circle when the control signal is "0" (L), and selects the contact indicated by a solid circle when the control signal is "1" (H).

Next, generation of a clock CK2 for the two-times pixel modulation will be described. CK2 is generated in the manner like CK1. FF 415 outputs CK2 (CK2a to CK2d) having a period two times that of SCK and a duty of 50% in accordance with the state of mode signals M3 and M4. FF 415 has a data input terminal to which ½-SCK or D-½-SCK selected by the mode signal M4 at switch 413 is supplied, and a clock input terminal to which EQ2 and its inverted signal NEQ2 selected by the mode signal M3 at a switch 414 are supplied.

Inverted signals of CK2a to CK2d are selected by a switch 416 under the control of a mode signal M5. In accordance with the mode signal state (M3, M4, M5), clock signals CK2 having a period two times that of SCK and a duty of 50% can be obtained on the basis of one fourth the period of SCK. Similar to CK1, since the level at the hatched portions of signals CK2e to CK2h shown in FIGS. 37(r) to 37(u) are required to be set to the L level, these signals are outputted after being gated by an output BLK2 of FF 418 whose input clock signal is switched by the mode signal M4 at a switch 417.

Generation of a clock CK3 for the three-times pixel modulation is basically the same as the seventh embodiment (FIG. 25). In this embodiment, as the clock to be inputted to the three-times pixel modulation clock generator unit, a switch 420 controlled by the mode signal M3 selects EQ1 when M3 takes the L level, and selects DEQ1 when M3 takes the H level. The clock signal (output from the switch 420) is gated by a blanking signal BLK3 when one of mode signals M5 and M6 takes the H level.

BLK3 is outputted from one of first and second FFs 421 and 422. FF 421 has, as its clock input, DEQ2 and its inverted signal NDEQ2, and as its data input, the H level. FF 422 has, as its clock input, NDEQ2, and as its data input, an output of the first FF 421. A switch 423 controlled by the mode signal M6 selects an 10 output of the first FF 421 when M6 takes the L level, and selects an output of the second FF 422 when M6 takes the H level.

In the succeeding operation, similar to the seventh embodiment, clocks having a period three times that of SCK and a duty of 50% are replaced by DEQ2 having a phase difference of one fourth the period of the input clock SCK. Therefore, in accordance with the mode signal state, clock signals CK3a to CK3l can be obtained on the basis of one fourth the period of SCK.

FIGS. 39(a) to 39(c) show the relationship between the modulation phase and mode at each modulation pixel unit.

Figure 40:
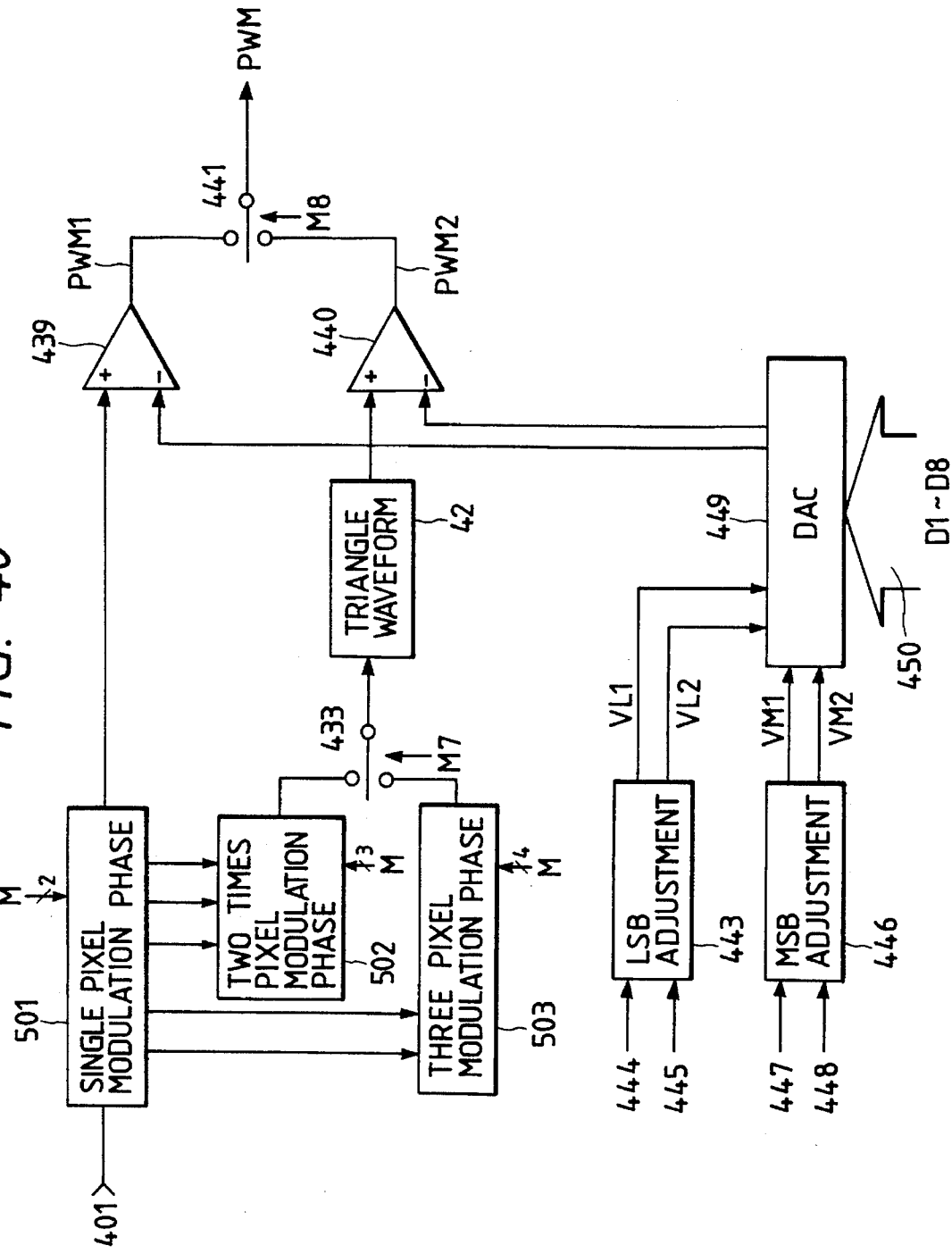
FIG. 40 shows a circuit diagram of a PWM modulation circuit including the structure shown in FIG. 36.

FIG. 40 is a block diagram of a pixel modulation apparatus containing the blocks shown in FIG. 36. This apparatus is realized by simply replacing the first triangular wave generator circuit 346, two-times and three-times pixel modulation phase control circuits 347 and 348 of the eighth embodiment shown in FIG. 30 by the single, two-times and three-times pixel modulation phase control circuits 501, 502 and 503 shown in FIG. 40. The pixel modulation operation of this apparatus is therefore same as that of the eighth embodiment.

In the embodiment shown in FIG. 36, the single pixel modulation clocks CK1 and two-times pixel modulation clocks CK2 are generated by using the identical logical structure. Therefore, the output timings of these clocks are entirely coincident.

The processes of generating the three-times pixel modulation clocks are from EQ1, to (switches (420, 425, 428, 431) - EXOR - FF) and to CK3. The processes of generating the single pixel modulation clocks are from EQ1 to (switches (407, 410) - FF - AND) and to CK1. Assuming that the AND gate and switch circuit have the same delay time, CK3 is outputted with only one switch delay time relative to CK1.

CK2 and CK3 are switched by the switch 433 for the two-times and three-times pixel modulation outputs. Therefore, CK2 and CK3 are delayed by the switch time of the switch 433 relative to CK1. As a result, CK2 and CK3 are delayed by the delay time of one switch for the two-times pixel modulation output, and by the delay time of two switches. This delay time is extremely short in the order of several hundreds psec in an IC circuit. It can be said, therefore, that the tracking of the single, two-times, and three-times pixel modulation output timings is very good.

Figure 41:
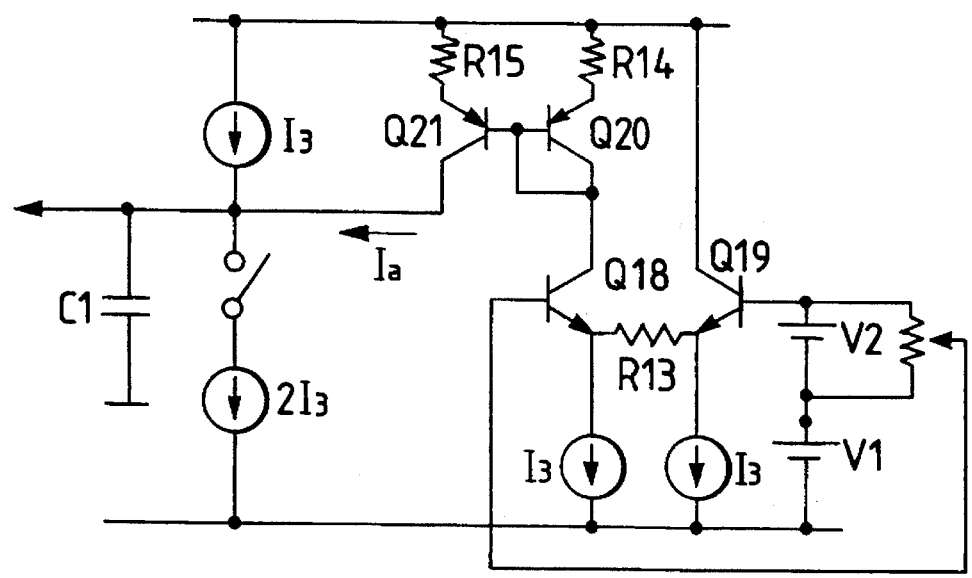
FIG. 41 shows a charge pump circuit usable in place of the charge pump circuit and LSB or MSB shown in FIG. 40.

A charge/discharge current ratio adjusting circuit for a charge pump circuit shown in FIG. 41 may be used in place of the LSB and MSB adjusting circuits in each of the above-described embodiments.

The circuit shown in FIG. 41 is designed to have a setting range of 0 to 50% by V2=(RI3 * I3). However, the triangular wave cannot be compared at 0%. Therefore, the setting range of (50—50 * k) to 50% is used with V2=k * (RI3 * I3) where 0<k<1. V1 is a voltage satisfying the D range of the circuit. If the base potential V (Q18/B) of the transistor Q18 is V1, the adjusting current Ia is 0 stabilizing the circuit at 50%. If V (Q18/B) is (V1+V2), Ia is I3 * k stabilizing the circuit at (50—50 * k).

Figure 42:
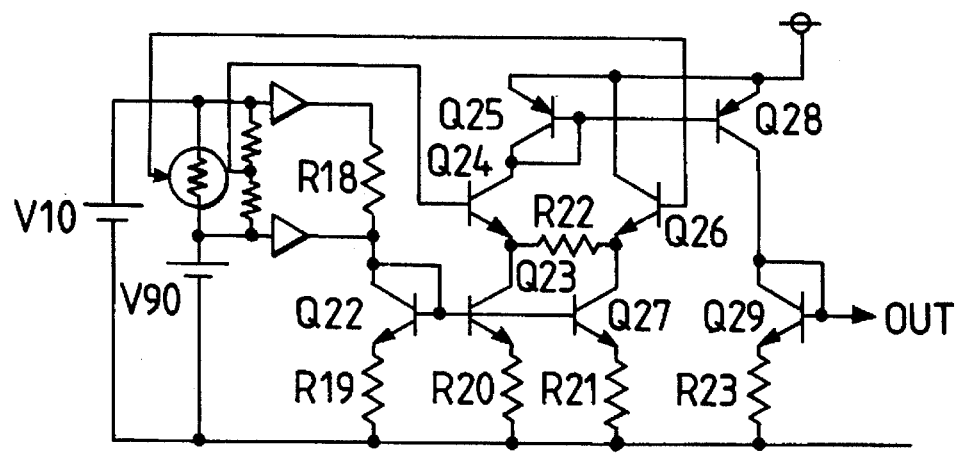
FIG. 42 shows another example of the structure of the MSB adjusting circuit.
Figure 43:
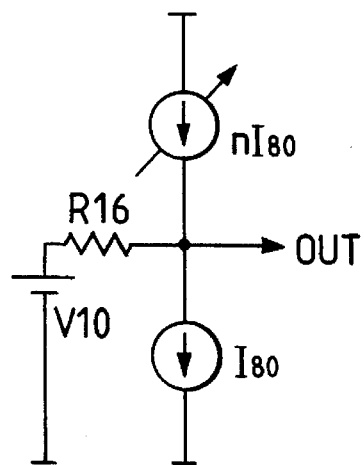
FIG. 43 shows another example of the structure of the LSB adjusting circuit.

The circuit structure shown in FIGS. 28 and 29 may be replaced with the variable offset circuit shown in FIG. 42 and the variable bias circuit shown in FIG. 43. The feature of the circuit shown in FIG. 42 is that a current I2 (=nI1) is supplied to the variable bias circuit. The current I2 is correlated with the current I1 which determines a minimum pulse width setting voltage of the variable offset circuit. The relationship between the comparing voltages V(OOH) and V(FFH) determining the minimum and maximum pulse widths is given by:

$$V(FFH)=V(OOH)-256 * V(LSB) \quad (1)$$

$$V(LSB)=RO * IO \quad (2)$$

where RO is a resistance value per one bit of R network of DAC, and IO is an output of the variable bias circuit (a standard current value of a constant current source group of DAC). Since V(FFH) is determined by the minimum pulse setting voltage V(OOH), if the adjusting range is set as:

$$V0 \leq V(OOH) \leq V25 \quad (3)$$

$$V70 \leq V(FFH) \leq V95 \quad (4)$$

then, the variable bias circuit is required to output the bias current IO so as to obtain V45≦V(FFH)≦V95, because the variable bias circuit does not know the value of V(00H). However, by adding the offset bias current I2 corresponding to the value of V(00H) to the output of the variable bias circuit, the variable bias value becomes large as V(00H) becomes high (narrow pulse width), and becomes small as V(00H) becomes low (broad pulse width). As a result, the adjusting range of V(FFH) becomes V70 to V95 irrespective of the value V(00H).

An example of designing the adjusting range given by (3) and (4) will be described below for the circuit shown in FIG. 42 at $V0 \leq VN \leq V80$ and $V0 \leq VW \leq V80$ $VN=V0 \rightarrow (00H)=V0$, $VN=V80 \rightarrow V(00H)=V25$, $R1=(\frac{3}{5}) * R80$, $R80 : V80=R80 * I100$, and $R2=(\frac{3}{16}) * R80$, where I100 is a current which controls the triangular wave level.

$VN=V0 \rightarrow V(00H)=V0$, $VN=V80 \rightarrow V(00H)=V25$, $I1=I3=I100$, $I2=(\frac{1}{3}) * I1$, and $R3=3 * R1$, where DAC is designed so as to satisfy V(00H)−V(FFH) =V45 at Io=I3.

Figure 44:
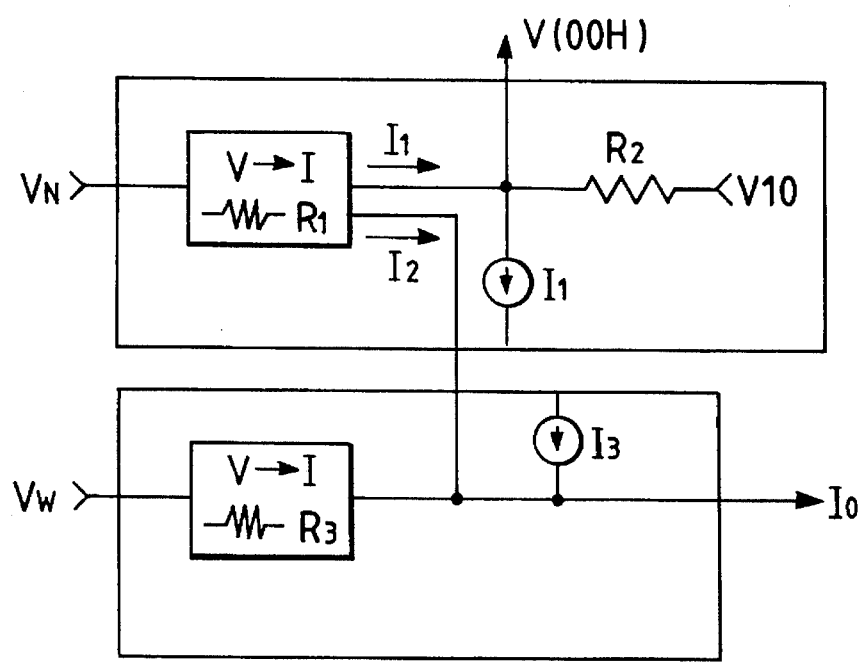
FIG. 44 shows another example of the structure of the MSB and LSB adjusting circuits.

The circuit structure shown in FIG. 44 may be used as the LSB and MSB adjusting circuits. The present invention is not limited to the above embodiments only, but various alterations are possible within the scope of the present invention. For example, combinations and modifications of the above embodiments fall within the scope of the present invention.

What is claimed is:

1. A triangular wave generator circuit comprising:

a triangular wave generator unit for generating a triangular wave signal;

a first comparator for comparing said generated triangular wave signal with a predetermined level; and a second comparator for comparing the triangular wave signal generated by said triangular wave generator unit with a second predetermined level different than said predetermined level, wherein said triangular wave generator unit generates the triangular wave signal in accordance with a comparison result by said first and said second comparators for maintaining a desired offset level and peak level.

2. A triangular wave generator circuit according to claim 1, wherein at least said triangular wave generator unit is composed of an IC.

3. A triangular wave generator circuit according to claim 1, wherein said triangular wave generator unit has a capacitor and a current source for charging and discharging said compacitor, and said current source is controlled in accordance with at least one of the comparison results by said first and second comparators.

4. A triangular wave generator circuit according to claim 1, further comprising a charge pump circuit having a capacitor being charged and discharged in accordance with the comparison result of one of said first and second comparators.

5. A triangular wave generator circuit according to claim 1, wherein said triangular wave generator unit generates a triangular wave signal in accordance with an input clock signal, said triangular wave generator unit further comprising means for limiting the level of a triangular wave signal to be outputted even if part of said input clock signal is missing.

6. A triangular wave generator circuit according to claim 1, wherein said triangular wave generator unit includes means for variably delaying a first clock signal to output a second clock signal, means for generating a third clock signal from said first and second clock signals, and means for generating a triangular wave signal from said third clock signal, and a delay amount of said variable delay means is controlled in accordance with the comparison result by one of said first and second comparators.

7. A triangular wave generator circuit according to claim 1, further comprising a second triangular wave generator unit for generating a second triangular wave signal having a different frequency from a triangular wave signal generated by said triangular wave generator unit.

8. A triangular wave generator circuit according to claim 7, wherein said triangular wave generator unit includes means for variably delaying a first clock signal to output a second clock signal, means for generating a third clock signal from said first and second clock signals, and means for generating a triangular wave signal from said third clock signal, and a delay amount of said delay means is controlled in accordance with the comparison result by one of said first and second comparators.

9. A triangular wave generator circuit according to claim 8, wherein said second triangular wave generator unit generates said second triangular wave signal in accordance with one of said first clock signal and said second clock signal generated in said triangular wave generator unit.

10. A pulse width modulating apparatus comprising:

a triangular wave signal generator unit for generating a triangular wave signal;

a first comparator for comparing said generated triangular wave signal with a predetermined level;

a second comparator for comparing the triangular wave signal generated by said triangular wave signal generator unit with a second predetermined level different than said predetermined level;

D/A converting means for converting input digital data into an analog signal; and a third comparator for comparing an output of said D/A converting means with said generated triangular wave signal and outputting a PWM signal, wherein said triangular wave signal generator unit generates the triangular wave signal in accordance with comparison results by said first and said second comparators for maintaining a desired offset level and peak level.

11. A pulse width modulating apparatus according to claim 10, wherein said triangular wave generator unit includes means for variably delaying a first clock signal to output a second clock signal, means for generating a third clock signal from said first and second clock signals, and means for generating a triangular wave signal from said third clock signal, and a delay amount of said variable delay means is controlled in accordance with the comparison result by one of said first and second comparators.

12. A pulse width modulating apparatus according to claim 10, further comprising a charge pump circuit having a capacitor being charged and discharged in accordance with the comparison result of one of said first and said second comparators.

13. A pulse width modulating apparatus according to claim 10, wherein said triangular wave signal generator unit generates a triangular wave signal in accordance with an input clock signal, said triangular wave signal generator further comprising means for limiting the level of a triangular wave signal to be outputted even if part of said input clock signal is missing.

14. A pulse width modulating apparatus according to claim 10, further comprising a second triangular wave signal generator unit for generating a second triangular wave signal having a different frequency from a triangular wave signal generated by said triangular wave signal generator unit.

15. A pulse width modulating apparatus according to claim 14, wherein said triangular wave generator unit includes means for variably delaying a first clock signal to output a second clock signal, means for generating a third clock signal from said first and second clock signals, and means for generating a triangular wave signal from the third clock signal, and a delay amount of said variable delay means is controlled in accordance with the comparison result by one of said first and second comparators.

16. A pulse width modulating apparatus according to claim 15, wherein said second triangular wave generator unit generates a second triangular wave signal in accordance with one of a plurality of clock signals having different phases.

17. A pulse width modulating apparatus according to claim 10, wherein said triangular wave generator unit generates a triangular wave signal in accordance with one of a plurality of clock signals having different phases.

18. A pulse width modulating apparatus according to claim 10, further comprising means for fixing the level of a PWM signal to be outputted when said input digital data is at least one of maximum and minimum values.

19. A triangular wave generator according to claim 6, further comprising:

a plurality of latch means for latching parallel data; and second delay means for delaying the third clock signal to output a fourth clock signal; and switching means for selecting and outputting data latched by said plurality of latch means in accordance with said third and fourth clock signals.

20. A triangular wave generator according to claim 7, wherein said triangular wave generator unit includes N delay elements having delay amounts of $T/2^i$ (i=1, 2, ..., N) relative to the period T of an input clock signal, where N is an integer 1 or larger; and switching means for selectively deriving a plurality of data in accordance with outputs of said N delay elements, and wherein said second triangular wave generator unit generates said second triangular wave signal in accordance with an output from said switching means.

21. A pulse width modulating apparatus according to claim 11, further comprising:

a plurality of latch means for latching parallel data; and second delay means for delaying the third clock signal to output a fourth clock signal; and switching means for selecting and outputting data latched by said plurality of latch means in accordance with said third and fourth clock signals.

22. A pulse width modulating apparatus according to claim 14, wherein said triangular wave generator unit includes N delay elements having delay amounts of $T/2^i$ (i=1, 2, ..., N) relative to the period T of an input clock signal, where N is an integer 1 or larger; and switching means for selectively deriving a plurality of data in accordance with outputs of said N delay elements, and wherein said second triangular wave generator unit generates said second triangular wave signal in accordance with an output from said switching means.

23. A pulse width modulating apparatus according to claim 22, wherein delay amounts of said delay elements are controlled in accordance with the comparison result of one of said first and third comparators.

24. A triangular wave generator circuit comprising:

a triangular wave generator unit for generating a triangular wave signal; and a comparator for comparing said generated triangular wave signal with a predetermined level, wherein said triangular wave generator unit includes means for variably delaying a first clock signal to output a second clock signal, means for generating a third clock signal from said first and second clock signals, and a delay amount of said variable delay means is controlled in accordance with a comparison result by said comparator for maintaining a desired offset level and peak level.

25. A triangular wave generator circuit according to claim 24, wherein at least said triangular wave generator unit is composed of an integrated circuit.

26. A triangular wave generator circuit according to claim 24, wherein said triangular wave generator unit has a capacitor and a current source for charging and discharging said capacitor, and said current source is controlled in accordance with the comparison result by said comparator.

27. A triangular wave generator circuit according to claim 24, further comprising a charge pump circuit having a capacitor being charged and discharged in accordance with the comparison result of said comparator.

28. A triangular wave generator circuit according to claim 24, further comprising a second triangular wave generator unit for generating a second triangular wave signal having a different frequency from the triangular wave signal generated by said triangular wave generator unit.

29. A triangular wave generator circuit according to claim 28, wherein said second triangular wave generator unit generates said second triangular wave signal in accordance with one of said first clock signal and said second clock signal generated in said triangular wave generator unit.

30. A triangular wave generator according to claim 24, further comprising:

a plurality of latch means for latching parallel data; and second delay means for delaying the third clock signal to output a fourth clock signal; and switching means for selecting and outputting data latched by said plurality of latch means in accordance with said third and fourth clock signals.

31. A triangular wave generator according to claim 28, wherein said triangular wave generator unit includes N delay elements having delay amounts of $T/2^i$ (i=1,2,...N) relative to the period T of an input clock signal, where N is an integer 1 or larger; and switching means for selectively deriving a plurality of data in accordance with outputs of said N delay elements, wherein said second triangular wave generator unit generates said second triangular wave signal in accordance with an output from said switching means.

32. A triangular wave generator according to claim 31, wherein delay amounts of said N delay elements are controlled in accordance with the comparison result of said comparator.

33. A triangular wave generator according to claim 24, wherein said triangular wave generator comprises means for frequency dividing an input clock signal and generating the first clock signal.

34. A pulse width modulating apparatus comprising:

a triangular wave signal generator unit for generating a triangular wave signal;

a first comparator for comparing said generated triangular wave signal with a predetermined level;

D/A converting means for converting input digital data into an analog signal;

a second comparator for comparing an output of said D/A converting means with said generated triangular wave signal and outputting a PWM signal, wherein said triangular wave signal generator unit includes means for variably delaying a first clock signal to output a second clock signal, means for generating a third clock signal from said first and second clock signals, means for generating a third clock signal from said first and second clock signals, and means for generating a triangular wave signal from said third clock signal, and a delay amount of said variable delay means being controlled in accordance with the comparison result by said first comparator for maintaining a desired offset level and peak level.

35. A pulse width modulating apparatus according to claim 34, further comprising a charge pump circuit having a capacitor being charged and discharged in accordance with the comparison result of said first comparator.

36. A pulse width modulating apparatus according to claim 34, wherein said triangular wave signal generator unit generates the triangular wave signal in accordance with an input clock signal, said triangular wave signal generator further comprising means for limiting a level of a triangular wave signal to be outputted even if a part of said input clock signal is missing.

37. A pulse width modulating apparatus according to claim 34, further comprising a second comparator for comparing the triangular wave signal generated by said triangular wave signal generator unit with a second predetermined level different from said predetermined level.

38. A pulse width modulating apparatus according to claim 34, further comprising a second triangular wave signal generator unit for generating a second triangular wave signal having a different frequency from the triangular wave signal generated by said triangular wave generator unit.

39. A pulse width modulating apparatus according to claim 38, wherein said second triangular wave signal generator unit generates the second triangular wave signal in accordance with one of a plurality of clock signals having different phases.

40. A pulse width modulating apparatus according to claim 34, further comprising means for fixing a level of a PWM signal to be outputted when said input digital data is at least one of maximum and minimum values.

41. A pulse width modulating apparatus according to claim 34, further comprising:

a plurality of latch means for latching parallel data;

switching means for selecting and outputting data latched by said plurality of latch means in accordance with said third and fourth clock signals.

42. A pulse width modulating apparatus according to claim 38, wherein said triangular wave signal generator unit include N delay elements having delay amount of $T/2^i$ ($i=1,2 \ldots, N$) relative to a period T of an input clock signal, where N is an integer 1 or larger; and switching means for selectively deriving a plurality of data in accordance with the outputs of said N delay elements, wherein said second triangular wave signal generator unit generates said second triangular wave signal in accordance with an output from said switching means.

43. A pulse width modulating apparatus according to claim 42, wherein delay amounts of said delay elements are controlled in accordance with the comparison result of one of first and second said comparators.

44. A triangular wave generator according to claim 20, wherein delay amounts of said delay elements are controlled in accordance with the comparison result of one of said first and said second comparators.

* * * * *

UNITED STATES PATENT AND TRADEMARK OFFICE
CERTIFICATE OF CORRECTION

PATENT NO. : 5,502,419

DATED : March 26, 1996

INVENTORS : SOMEI KAWASAKI ET AL.

It is certified that error appears in the above-identified patent and that said Letters Patent is hereby corrected as shown below:

ON THE TITLE PAGE

[56] Foreign Patent Documents

"4140914" should read --4-140914-- and "4170219" should read --4-170219--.

[56] Attorney Agent or Firm

"Fitzpatrick, Cellar, Harper & Scinto" should read --Fitzpatrick, Cella, Harper & Scinto--.

COLUMN 1

Line 31, "(FIGS. 2(b))" should read --(FIG. 2(b)--;
"bits for examples is" should read --bits, for example, is--.

COLUMN 2

Line 29, "unit" should read --units--;
Line 44, "white" should read --the white--.

COLUMN 5

Line 34, "3(A) 3(B) and 3C" should read --3(A), 3(B), and 3(C)--;

UNITED STATES PATENT AND TRADEMARK OFFICE
CERTIFICATE OF CORRECTION

PATENT NO. : 5,502,419                         Page 2 of 4

DATED       : March 26, 1996

INVENTORS   : SOMEI KAWASAKI ET AL.

It is certified that error appears in the above-identified patent and that said Letters Patent is hereby corrected as shown below:

Line 51, "shows as" should read --shows an--.

COLUMN 7

Line 50, "$_{size}$ = Q37 $_{emitter}$ 9*" should read --$_{size}$ =Q37 $_{emitter}$ $_{size,}$ 9*--.

COLUMN 8

Line 20, "elements those" should read --those elements--.

COLUMN 13

Line 44, "the rating levels" should read --the same rating levels--;
　　Line 61,  "so that even" should read --so that even if--.

UNITED STATES PATENT AND TRADEMARK OFFICE
CERTIFICATE OF CORRECTION

PATENT NO. : 5,502,419

DATED : March 26, 1996

INVENTORS : SOMEI KAWASAKI ET AL.

It is certified that error appears in the above-identified patent and that said Letters Patent is hereby corrected as shown below:

COLUMN 14

Line 26, "is parallel inputted" should read --are input in parallel--.

COLUMN 17

Line 8, "delay of" should read --delay of 120° from the output of DFF--;

Line 52, "[Ninth Embodiment" should read --[Ninth Embodiment]--.

COLUMN 18

Line 11, "is however difficult" should read --is, however, difficult--.

UNITED STATES PATENT AND TRADEMARK OFFICE
CERTIFICATE OF CORRECTION

PATENT NO. : 5,502,419

DATED : March 26, 1996

INVENTORS : SOEMI KAWASAKI ET AL.

It is certified that error appears in the above-identified patent and that said Letters Patent is hereby corrected as shown below:

<u>COLUMN 20</u>

Line 5,  "is therefore same" should read --is therefore the same--;
Line 37, "(50---50*K) should read --(50-50*K)--;
Line 42, "(50---50*K) should read --(50-50*K)--;
Line 62, "V0≤V(00H)≤V25" should be in italics;
Line 64, "V70≤V(FFH)≤V95" should be in italics.

Signed and Sealed this

Eighth Day of October, 1996

*Attest:*

BRUCE LEHMAN

*Attesting Officer*    Commissioner of Patents and Trademarks